(12) United States Patent
Tonegawa

(10) Patent No.: US 12,272,703 B2
(45) Date of Patent: Apr. 8, 2025

(54) SOLID-STATE IMAGING ELEMENT AND SOLID-STATE IMAGING ELEMENT MANUFACTURING METHOD

(71) Applicant: SONY SEMICONDUCTOR SOLUTIONS CORPORATION, Kanagawa (JP)

(72) Inventor: Susumu Tonegawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 620 days.

(21) Appl. No.: 17/618,562

(22) PCT Filed: May 19, 2020

(86) PCT No.: PCT/JP2020/019711
§ 371 (c)(1),
(2) Date: Dec. 13, 2021

(87) PCT Pub. No.: WO2020/261817
PCT Pub. Date: Dec. 30, 2020

(65) Prior Publication Data
US 2022/0246653 A1    Aug. 4, 2022

(30) Foreign Application Priority Data

Jun. 25, 2019    (JP) .................. 2019-116867

(51) Int. Cl.
*H01L 27/146* (2006.01)
*H01L 49/02* (2006.01)

(52) U.S. Cl.
CPC .. *H01L 27/14612* (2013.01); *H01L 27/14636* (2013.01); *H01L 27/1464* (2013.01); *H01L 27/14689* (2013.01); *H01L 28/90* (2013.01)

(58) Field of Classification Search
CPC ..... H01L 27/04; H01L 27/146; H01L 27/822; H01L 27/14612; H01L 27/14636; H01L 27/1464; H01L 27/14689; H01L 21/822
(Continued)

(56) References Cited

U.S. PATENT DOCUMENTS

2006/0208159 A1    9/2006   Nishimura
2006/0221667 A1   10/2006   Ogura et al.
(Continued)

FOREIGN PATENT DOCUMENTS

JP    H04-026156    1/1992
JP    H11-274434    10/1999
(Continued)

OTHER PUBLICATIONS

International Search Report prepared by the Japan Patent Office on Jul. 27, 2020, for International Application No. PCT/JP2020/019711, 3 pgs.

*Primary Examiner* — Fazli Erdem
(74) *Attorney, Agent, or Firm* — Sheridan Ross PC

(57) ABSTRACT

A solid-state imaging element including a semiconductor substrate having a photodiode and a floating diffusion; a capacitor that includes a PD side electrode disposed on a surface of the photodiode opposite to a surface into which the light enters, and an opposite PD side electrode facing the PD side electrode with a dielectric film therebetween; an amplification transistor; and an FD side wiring electrode. At least a part of the PD side electrode and the FD side wiring electrode are formed in the semiconductor substrate and extend in a thickness direction of the semiconductor substrate. One end of a first contact hole in which at least a part of the PD side electrode is formed and one end of a second contact hole in which the FD side wiring electrode is formed
(Continued)

are both positioned in a surface of the semiconductor substrate on a side opposite to the photodiode side.

33 Claims, 31 Drawing Sheets

(58) Field of Classification Search
USPC ......................................................... 257/228
See application file for complete search history.

(56) References Cited

U.S. PATENT DOCUMENTS

| | | | |
|---|---|---|---|
| 2007/0131991 | A1 | 6/2007 | Sugawa |
| 2010/0261347 | A1 | 10/2010 | Nobutoh |
| 2013/0200479 | A1 | 8/2013 | Sakano et al. |
| 2018/0234651 | A1 | 8/2018 | Machida |
| 2019/0019820 | A1* | 1/2019 | Takizawa .............. H04N 25/771 |
| 2019/0122918 | A1* | 4/2019 | Mizuta ................. H04N 25/621 |
| 2020/0058688 | A1* | 2/2020 | Kwon ............... H01L 27/14689 |

FOREIGN PATENT DOCUMENTS

| | | |
|---|---|---|
| JP | 2002-299555 | 10/2002 |
| JP | 2006-261596 | 9/2006 |
| JP | 2006-262358 | 9/2006 |
| JP | 2009-165186 | 7/2009 |
| JP | 2010-251406 | 11/2010 |
| JP | 2013-161945 | 8/2013 |
| JP | 2014-123771 | 7/2014 |
| JP | 2015-050463 | 3/2015 |
| KR | 10-2004-0093905 | 11/2004 |
| TW | 201914289 A | 4/2019 |
| WO | WO 2005/083790 | 9/2005 |
| WO | WO 2017/043343 | 3/2017 |
| WO | WO 2017/169882 | 10/2017 |

* cited by examiner

SOLID-STATE IMAGING ELEMENT AND SOLID-STATE IMAGING ELEMENT MANUFACTURING METHOD

CROSS REFERENCE TO RELATED APPLICATIONS

This application is a national stage application under 35 U.S.C. 371 and claims the benefit of PCT Application No. PCT/JP2020/019711 having an international filing date of 19 May 2020, which designated the United States, which PCT application claimed the benefit of Japanese Patent Application No. 2019-116867 filed 25 Jun. 2019, the entire disclosures of each of which are incorporated herein by reference.

TECHNICAL FIELD

A technology according to the present disclosure (present technology) relates to a back-illuminated solid-state imaging element and a solid-state imaging element manufacturing method, for example.

BACKGROUND ART

In a case of a configuration adopted for disposing a capacitor on a back-illuminated solid-state imaging element, a capacitor having an MIS (Metal Insulator Silicon) structure is formed below a photodiode with respect to incident light, for example. However, according to the configuration which includes the capacitor having the MIS structure, the area for disposing the capacitor decreases when the area of the photodiode decreases as a result of miniaturization of the solid-state imaging element. In this case, it is difficult to reliably obtain an occupation area necessary for acquiring a capacity required by the capacitor.

Under these circumstances, a technology disclosed in PTL 1 has been developed, for example. According to this technology, a first semiconductor substrate where a photodiode and the like are formed and a second semiconductor substrate where a pixel transistor is formed are laminated on each other. In this configuration, a trench capacitor is provided on the second semiconductor substrate. The technology disclosed in PTL 1 does not produce a decreased area and thus can reliably obtain the area for the capacitor.

CITATION LIST

Patent Literature

[PTL 1]
  JP 2015-50463A

SUMMARY

Technical Problem

According to the technology disclosed in PTL 1, however, the solid-state imaging element is manufactured by laminating the first semiconductor substrate and the second semiconductor substrate after the trench capacitor is formed on the second semiconductor substrate. In this case, a large number of dedicated steps are required for forming the trench capacitor. Accordingly, there arises a problem that the number of steps required for manufacturing increases.

The present technology has been developed in consideration of the abovementioned problem. It is an object of the present technology to provide a solid-state imaging element which can achieve reduction of the number of steps required for manufacturing, and a method for manufacturing this solid-state imaging element.

Solution to Problem

A solid-state imaging element according to one aspect of the present technology includes a semiconductor substrate, a capacitor, an amplifier transistor, and an FD side wiring electrode. The semiconductor substrate includes a photodiode configured to photoelectrically convert incident light and a floating diffusion to which a signal charge accumulated in the photodiode is transferred. The capacitor includes a PD side electrode disposed on a surface of the photodiode on a side opposite to a surface into which the light enters, and an opposite PD side electrode facing the PD side electrode with a dielectric film interposed between the PD side electrode and the opposite PD side electrode. The amplification transistor reads, as an electric signal, the signal charge transferred to the floating diffusion and amplifies the signal charge. The FD side wiring electrode connects the floating diffusion and the amplification transistor. In addition, at least a part of the PD side electrode and the FD side wiring electrode are formed in the semiconductor substrate in such a shape as to extend in a thickness direction of the semiconductor substrate. Further, one end of a first contact hole in which at least a part of the PD side electrode is formed and one end of a second contact hole in which the FD side wiring electrode is formed are both positioned in a surface of the semiconductor substrate on a side opposite to the photodiode side.

A solid-state imaging element manufacturing method according to one aspect of the present technology includes a step of forming, on a semiconductor substrate, a photodiode configured to photoelectrically convert incident light and a floating diffusion to which a signal charge accumulated in the photodiode is transferred. The method further includes a step of forming a capacitor that includes a PD side electrode disposed on a surface of the photodiode on a side opposite to a surface into which the light enters, and an opposite PD side electrode facing the PD side electrode with a dielectric film interposed between the PD side electrode and the opposite PD side electrode. In addition, the method includes a step of forming an amplification transistor that reads, as an electric signal, the signal charge transferred to the floating diffusion and amplifies the signal charge. Further, the step of forming the capacitor includes a step of simultaneously forming, in the semiconductor substrate, a first contact hole in which at least a part of the PD side electrode is formed and a second contact hole in which an FD side wiring electrode that connects the floating diffusion and the amplification transistor is formed, the first contact hole and the second contact hole being formed in such a shape as to extend in a thickness direction of the semiconductor substrate, and a step of simultaneously forming the FD side wiring electrode and the PD side electrode.

A solid-state imaging element manufacturing method according to one aspect of the present technology includes a step of forming, on a semiconductor substrate, a photodiode configured to photoelectrically convert incident light and a floating diffusion to which a signal charge accumulated in the photodiode is transferred. The method further includes a step of forming a capacitor that includes a PD side electrode disposed on a surface of the photodiode on a side opposite to a surface into which the light enters, and an opposite PD side electrode facing the PD side electrode with a dielectric film interposed between the PD side electrode and the opposite PD side electrode. In addition, the method includes a step of forming an amplification transistor that reads, as an electric signal, the signal charge transferred to the floating diffusion and amplifies the signal charge. Further, the step of forming the capacitor includes a step of simultaneously forming, in the semiconductor substrate, a first contact hole in which at least a part of the PD side electrode is formed and a second contact hole in which an FD side wiring electrode that connects the floating diffusion and the amplification transistor is formed, the first contact hole and the second contact hole being formed in such a shape as to extend in a thickness direction of the semiconductor substrate.

A solid-state imaging element manufacturing method according to one aspect of the present technology includes a step of forming, on a semiconductor substrate, a photodiode configured to photoelectrically convert incident light and a floating diffusion to which a signal charge accumulated in the photodiode is transferred. The method further includes a step of forming a capacitor that includes a PD side electrode disposed on a surface of the photodiode on a side opposite to a surface into which the light enters, and an opposite PD side electrode facing the PD side electrode with a dielectric film interposed between the PD side electrode and the opposite PD side electrode. In addition, the method includes a step of forming an amplification transistor that reads, as an electric signal, the signal charge transferred to the floating diffusion and amplifies the signal charge. Further, a step of simultaneously forming the PD side electrode in a first contact hole for forming therein at least a part of the PD side electrode, and forming an FD side wiring electrode that connects the floating diffusion and the amplification transistor in a second contact hole for forming therein the FD side wiring electrode is included.

DESCRIPTION OF EMBODIMENTS

Embodiments of the present technology will hereinafter be described with reference to the drawings. In the expression of the drawings, identical or similar parts are given identical or similar reference signs, and repetitive explanation is omitted. The respective drawings are schematic figures and may contain points different from actual ones. The embodiments described hereinafter each present a device and a method for embodying a technical idea of the present technology by way of example. The technical idea of the present technology is not thus limited to the device and the method presented in the embodiments described below by way of example. The technical idea of the present technology can be modified in various manners within the technical scope described in the claims.

FIRST EMBODIMENT

<General Configuration of Solid-State Imaging Element>

For example, a solid-state imaging element according to a first embodiment is a back-illuminated solid-state imaging element.

As depicted in FIGS. 1 to 4, the solid-state imaging element has a semiconductor substrate including a first semiconductor substrate 101 and a second semiconductor substrate 102.

The first semiconductor substrate 101 is a substrate where a pixel circuit including a photodiode 110 and a floating diffusion 111 is disposed.

Figure 1:
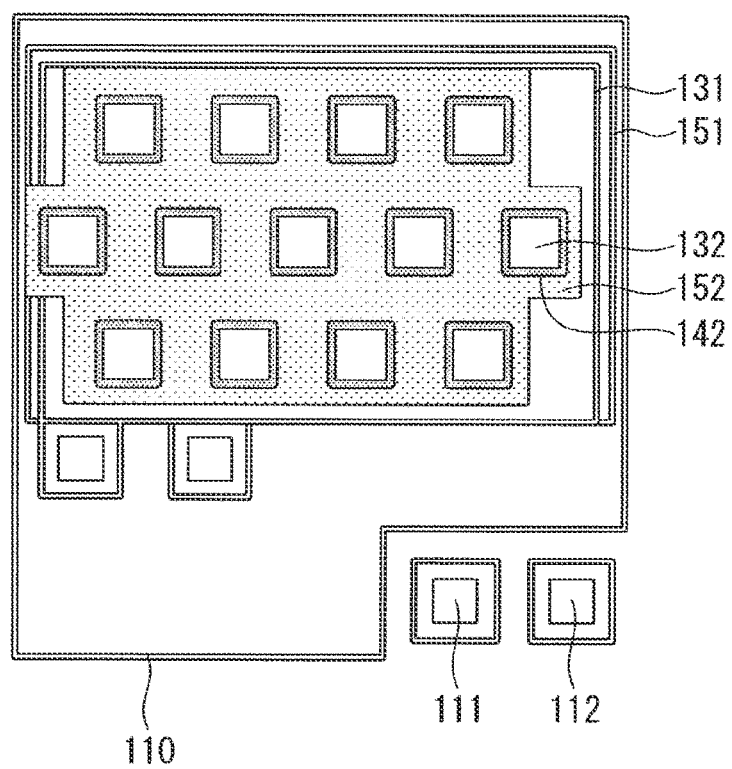
FIG. 1 is a bird's-eye view depicting a configuration of a first semiconductor substrate included in a solid-state imaging element according to a first embodiment.
Figure 2:
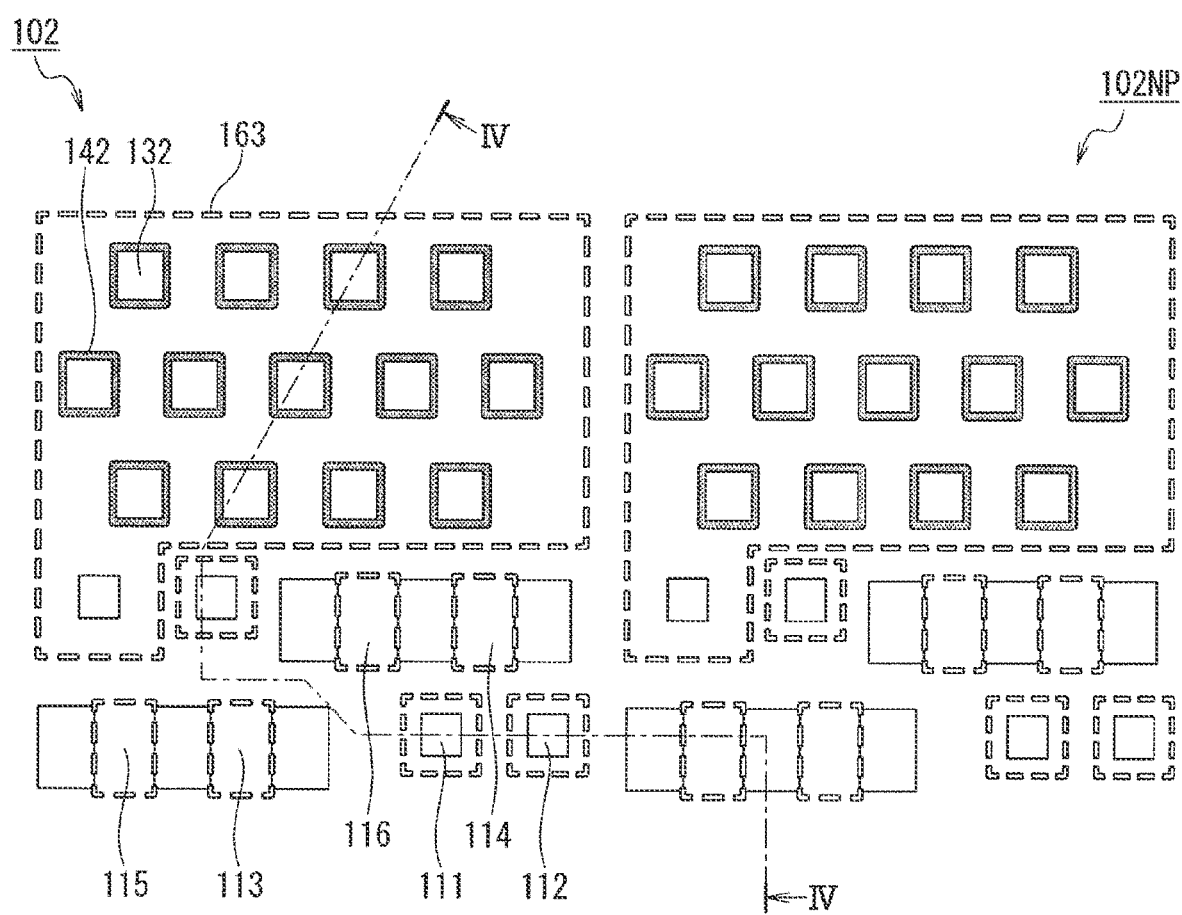
FIG. 2 is a bird's-eye view depicting a configuration of a second semiconductor substrate included in the solid-state imaging element according to the first embodiment.
Figure 3:
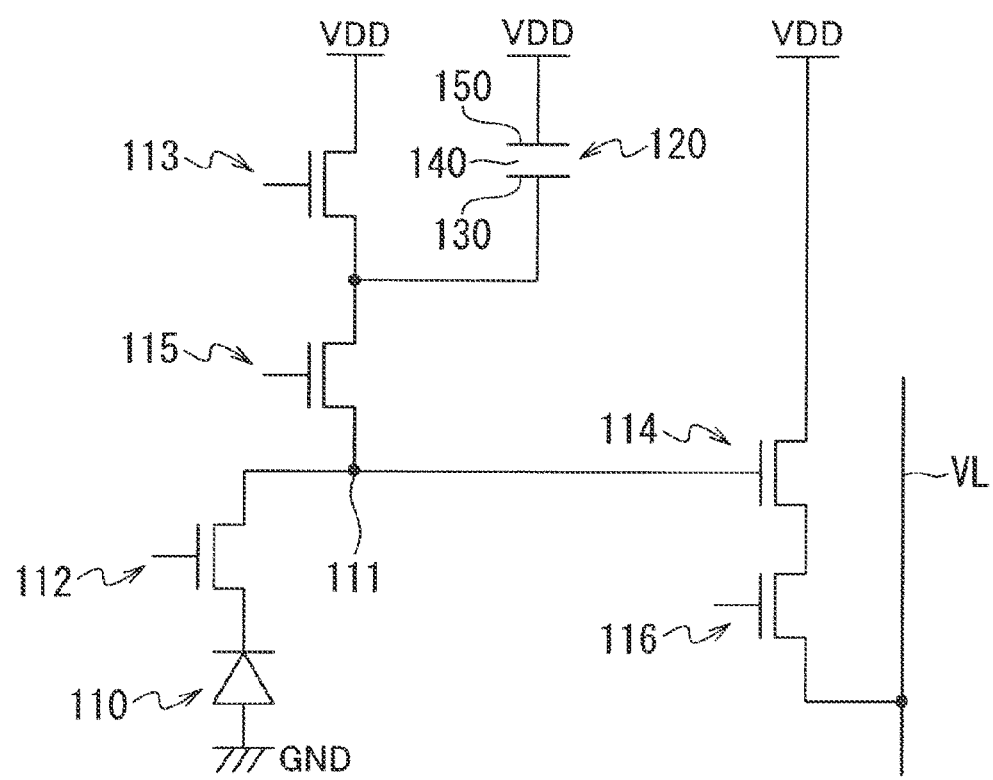
FIG. 3 is a circuit diagram depicting an equivalent circuit of the solid-state imaging element according to the first embodiment.
Figure 4:
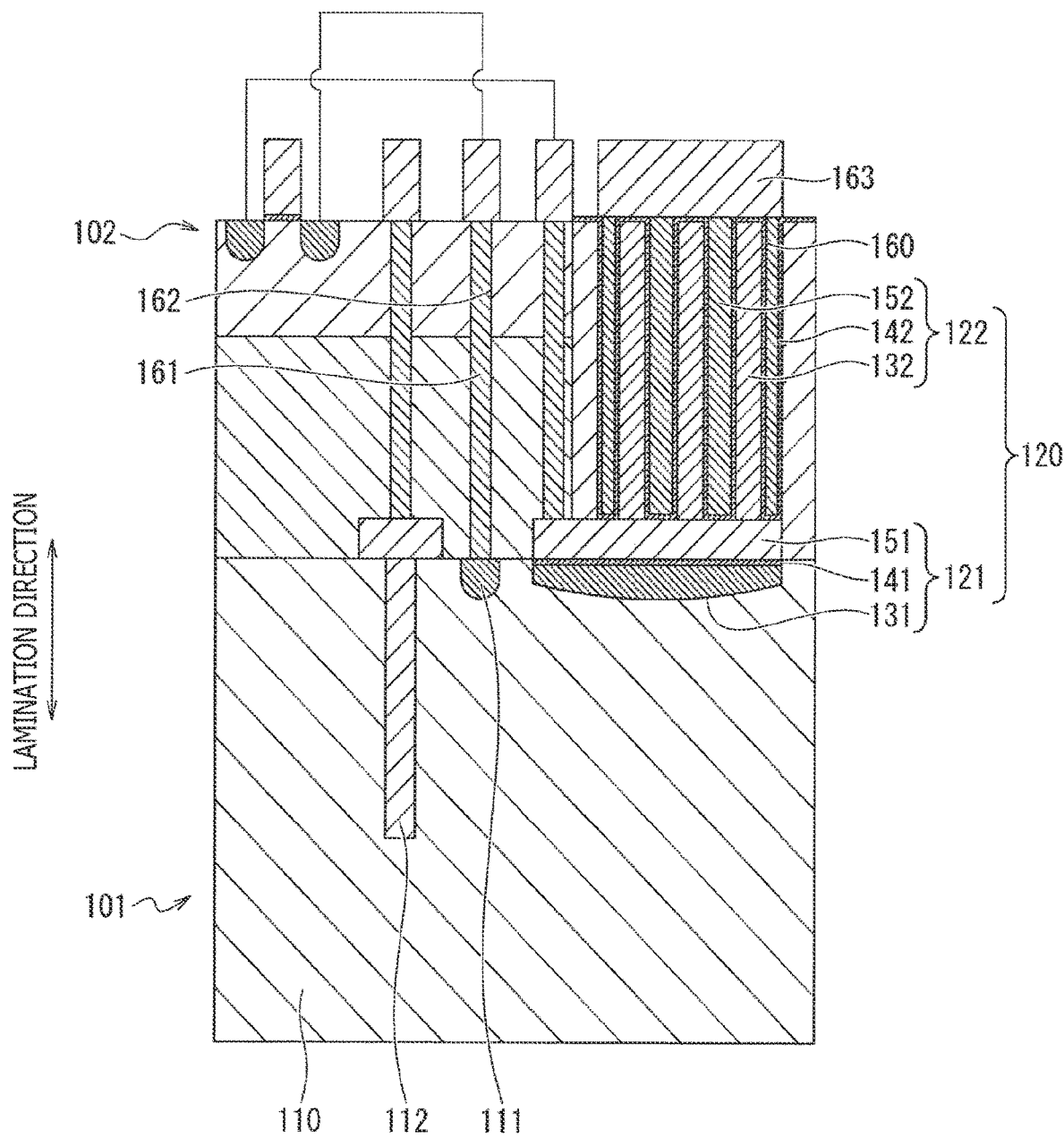
FIG. 4 is a cross-sectional diagram taken along a IV-IV line in FIG. 2.

The second semiconductor substrate 102 is a substrate laminated on a surface (upper surface in FIG. 4) of the first semiconductor substrate 101 on the side opposite to the photodiode 110 side. Note that FIG. 2 depicts a second semiconductor substrate 102NP of an adjacent pixel.

A fifth electrode 163 is formed on a surface (upper surface in FIG. 4) of the second semiconductor substrate 102 on the side opposite to a surface facing the first semiconductor substrate 101.

For example, the fifth electrode 163 is formed by using a polycrystal silicon film, for example. In addition, the fifth electrode 163 constitutes wiring which forms an equivalent circuit of the solid-state imaging element.

The photodiode 110 photoelectrically converts incident light, and generates and accumulates electric charges corresponding to a light amount of photoelectric conversion.

One end of the photodiode 110 is grounded. The other end of the photodiode 110 is connected to a source electrode of a transfer transistor 112.

The floating diffusion 111 is formed at a point (connection point) connecting a drain electrode of the transfer transistor 112, a source electrode of a switch transistor 115, and a gate electrode of an amplification transistor 114.

In addition, the floating diffusion 111 accumulates electric charges transferred from the photodiode 110 via the transfer transistor 112, and converts the electric charges into voltage. In other words, signal charges accumulated in the photodiode 110 are transferred to the floating diffusion 111.

The transfer transistor 112 is disposed between the photodiode 110 and the floating diffusion 111. The drain electrode of the transfer transistor 112 is connected to a drain electrode of a reset transistor 113 and the gate electrode of the amplification transistor 114.

In addition, the transfer transistor 112 permits or cuts off transfer of electric charges from the photodiode 110 to the floating diffusion 111 according to a driving signal supplied from a not-depicted timing control unit to the gate electrode.

The switch transistor 115 is disposed between the floating diffusion 111 and the reset transistor 113. A drain electrode of the switch transistor 115 is connected to a source electrode of the reset transistor 113 and a capacitor 120.

In addition, the switch transistor 115 permits or cuts off transfer of electric charges from the capacitor 120 to the floating diffusion 111 according to a switching signal supplied from a not-depicted switching control unit to the gate electrode.

The capacitor 120 has a PD side electrode 130, a dielectric film 140, and an opposite PD side electrode 150.

The PD side electrode 130 is an electrode disposed on a surface of the photodiode 110 on the side opposite to a surface into which light enters.

The opposite PD side electrode 150 is an electrode facing the PD side electrode 130 with the dielectric film 140 interposed between the opposite PD side electrode 150 and the PD side electrode 130.

In addition, the capacitor 120 includes a first capacitor portion 121 and a second capacitor portion 122.

The first capacitor portion 121 is a capacitor formed in a first capacitor region defined in the first semiconductor substrate 101 beforehand.

The first capacitor region is defined at a position different from the position of the floating diffusion 111 in the first semiconductor substrate 101.

The first capacitor portion 121 has a first electrode 131, a first dielectric film 141, and a second electrode 151.

The first electrode 131 is an electrode disposed on a surface of the photodiode 110 in the first capacitor region on the side opposite to a surface into which light enters. The first electrode 131 and the floating diffusion 111 are provided apart from each other.

In addition, the first electrode 131 is formed by using phosphorus or arsenic that is ion-implanted in the first capacitor region.

The first dielectric film 141 is laminated on the first electrode 131.

In addition, the first dielectric film 141 is formed by using a silicon oxide film.

The second electrode 151 is laminated on the first dielectric film 141.

In addition, the second electrode 151 is formed by using a polycrystal silicon film.

The second capacitor portion 122 is a capacitor disposed on a surface of the first capacitor portion 121 on the side opposite to the photodiode 110 side.

The second capacitor portion 122 has a third electrode 132, a second dielectric film 142, and a fourth electrode 152.

The third electrode 132 is a column-shaped electrode which forms the PD side electrode 130 and has one end (lower end in FIG. 4) connected to the second electrode 151.

In addition, the third electrode 132 is formed by using a high melting metal such as tungsten, titanium nitride, cobalt, and ruthenium. Note that the high melting metal is a metal which has a melting point higher than that of iron, for example.

Further, the third electrode 132 is provided inside a first contact hole 160.

The first contact hole 160 is a void portion formed in the semiconductor substrate (first semiconductor substrate 101 and second semiconductor substrate 102) and shaped to extend in a thickness direction of the semiconductor substrate.

Accordingly, the third electrode 132 forming the PD side electrode 130 is provided inside the first contact hole 160. Specifically, at least a part of the PD side electrode 130 is formed inside the first contact hole 160. In addition, the PD side electrode 130 is formed in the semiconductor substrate in such a shape as to extend in the thickness direction of the semiconductor substrate.

In addition, a part of the third electrode 132 forming the PD side electrode 130 is formed inside the first semiconductor substrate 101, while the remaining part of the third electrode 132 is formed inside the second semiconductor substrate 102.

Further, a part of the first contact hole 160 is formed inside the first semiconductor substrate 101, while the remaining part of the first contact hole 160 is formed inside the second semiconductor substrate 102.

The second dielectric film 142 forms the dielectric film 140 and covers a portion of the third electrode 132 other than a connection portion between the third electrode 132 and the second electrode 151 (a side surface and an upper surface of the third electrode 132).

Accordingly, a part of the second dielectric film 142 is formed inside the first semiconductor substrate 101, while the remaining part of the second dielectric film 142 is formed inside the second semiconductor substrate 102.

In addition, the second dielectric film 142 is formed by using a ferroelectric film.

Examples adoptable as the ferroelectric film include a lamination film of an oxide film and a nitride film, a lamination film of an oxide film and a tantalum pentoxide film, a lamination film of a nitride film and a tantalum pentoxide film, a lamination film of an oxide film, a nitride film, and a tantalum pentoxide film, a hafnium and a hafnium alloy material, BST, PZT, and the like.

The fourth electrode 152 is an electrode that forms the opposite PD side electrode 150 and that faces the third electrode 132 with the second dielectric film 142 interposed between the fourth electrode 152 and the third electrode 132.

In addition, similarly to the third electrode 132, the fourth electrode 152 is formed by using a high melting metal such as tungsten, titanium nitride, cobalt, and ruthenium.

In addition, the solid-state imaging element includes an FD side wiring electrode 161 which connects the floating diffusion 111 and the amplification transistor 114.

The FD side wiring electrode 161 is provided inside a second contact hole 162.

In addition, similarly to the third electrode 132, the FD side wiring electrode 161 is formed by using a high melting metal such as tungsten, titanium nitride, cobalt, and ruthenium.

The second contact hole 162 is a void portion formed in the semiconductor substrate (first semiconductor substrate 101 and second semiconductor substrate 102) and shaped to extend in the thickness direction of the semiconductor substrate.

Accordingly, a part of the FD side wiring electrode 161 is formed inside the first semiconductor substrate 101, while the remaining part of the FD side wiring electrode 161 is formed inside the second semiconductor substrate 102. In addition, the FD side wiring electrode 161 is formed in the semiconductor substrate in such a shape as to extend in the thickness direction of the semiconductor substrate.

Further, one end of the first contact hole 160 and one end of the second contact hole 162 (both are upper opened ends in FIG. 4) are positioned in a surface of the semiconductor substrate (first semiconductor substrate 101 and the second semiconductor substrate 102) on the side opposite to the photodiode 110.

The source electrode of the reset transistor 113 is connected to the switch transistor 115, while a drain electrode of the reset transistor 113 is connected to power source wiring VDD.

In addition, the reset transistor 113 permits or cuts off discharge of electric charges accumulated in the floating diffusion 111, according to a driving signal supplied from the timing control unit to the gate electrode.

The gate electrode of the amplification transistor 114 is connected to the floating diffusion 111, while a source electrode of the amplification transistor 114 is connected to the power source wiring VDD. A drain electrode of the amplification transistor 114 is connected to a source electrode of a selection transistor 116.

In addition, the amplification transistor 114 reads, as a reset level, a potential of the floating diffusion 111 reset by the reset transistor 113. Further, the amplification transistor 114 amplifies voltage corresponding to signal charges transferred by the transfer transistor 112 and accumulated in the floating diffusion 111. In other words, the amplification transistor 114 reads, as electric signals, the signal charges transferred to the floating diffusion 111 and amplifies the signal charges.

The voltage (voltage signals) amplified by the amplification transistor 114 is output to a vertical signal line VL via the selection transistor 116.

The floating diffusion 111 and the amplification transistor 114 are herein connected to each other by the FD side wiring electrode 161.

For example, a drain electrode of the selection transistor 116 is connected to one end of the vertical signal line VL, while a source electrode of the selection transistor 116 is connected to the drain electrode of the amplification transistor 114.

In addition, the selection transistor 116 permits or cuts off output of a voltage signal from the amplification transistor 114 to the vertical signal line VL according to a driving signal SEL supplied from the timing control unit to the gate electrode.

In this manner, the selection transistor 116 comes into a conductive state when a selection control signal is supplied to the gate electrode, and selects a unit pixel in synchronization with vertical scanning performed by a vertical scanning circuit (not depicted). Note that the selection transistor 116 may be configured to be connected between the source electrode of the amplification transistor 114 and a source line.

The vertical signal line VL (vertical signal line) is a wire which outputs electric signals amplified by the amplification transistor 114. The drain electrode of the selection transistor 116 is connected to one end of the vertical signal line VL. A not-depicted A/D converter is connected to the other end of the vertical signal line VL.

<Solid-State Imaging Element Manufacturing Method>

A manufacturing method for manufacturing the solid-state imaging element of the first embodiment will be described with reference to FIGS. 5 to 10 along with FIGS. 1 to 4.

Figure 5:
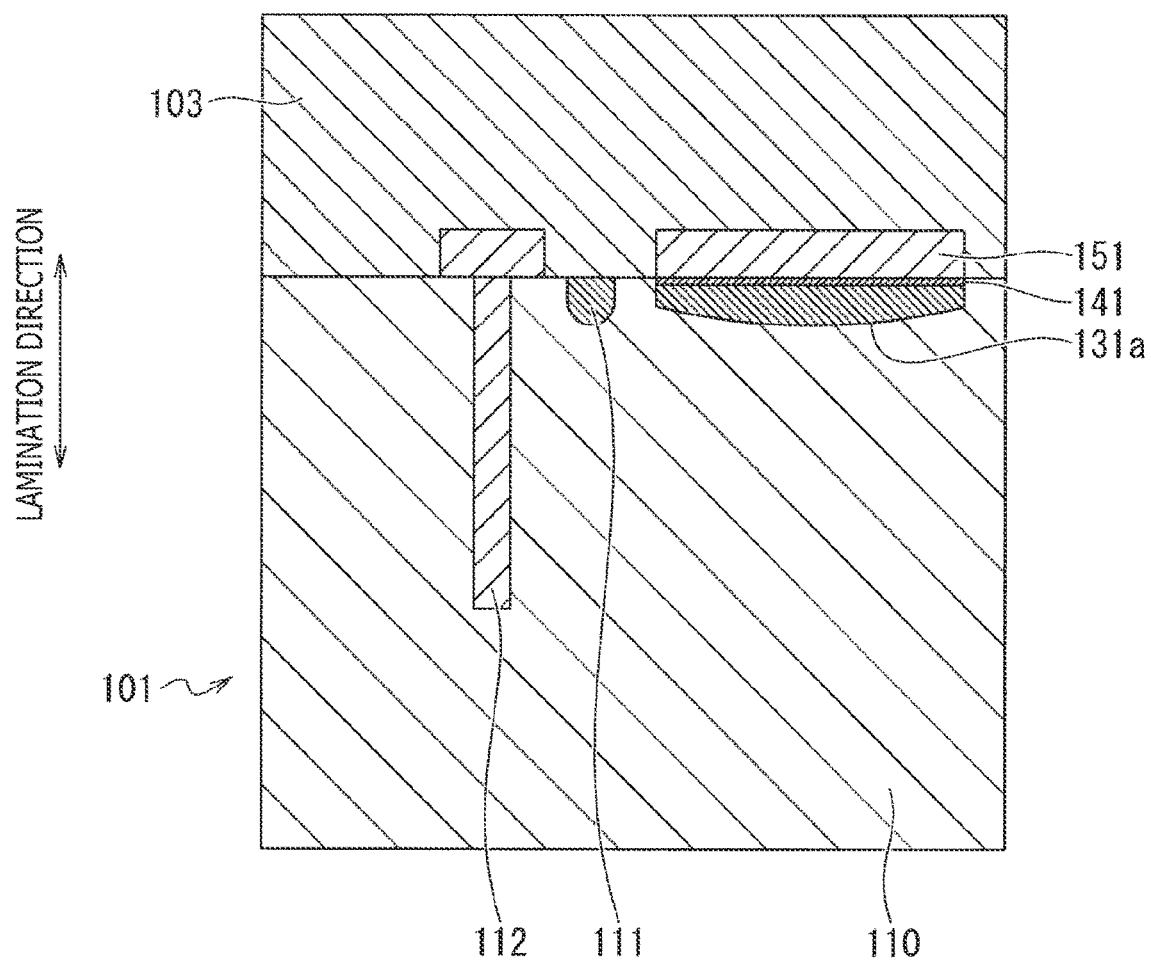
FIG. 5 is a cross-sectional diagram depicting a solid-state imaging element manufacturing method according to the first embodiment.

According to the solid-state imaging element manufacturing method, the photodiode 110, the floating diffusion 111, and the transfer transistor 112 are first produced on the first semiconductor substrate 101 formed by using silicon, as depicted in FIG. 5. Specifically, the solid-state imaging element manufacturing method includes a step of forming the photodiode 110 and the floating diffusion 111 on the semiconductor substrate.

In addition, phosphorus or arsenic is ion-implanted in a capacitor region, which is a region defined in the first semiconductor substrate 101 beforehand, by using an ion implantation method. This process forms an N+ region 131a which becomes the first electrode 131 later. The N+ region 131a becomes the first electrode 131 after heat treatment to be performed as a post-process.

Subsequently, a gate oxide film of the transfer transistor 112 is formed. In addition, the first dielectric film 141 laminated on the N+ region 131a is formed on an upper surface of the N+ region 131a (upper surface in FIG. 5) by using a silicon oxide film formed by plasma CVD.

Thereafter, a gate electrode of the transfer transistor 112 is formed. In addition, the second electrode 151 laminated on the first dielectric film 141 is formed on a surface of the first dielectric film 141 (upper surface in FIG. 5) on the side opposite to a surface facing the N+ region 131a, by using a polycrystal silicon film formed by thermal CVD. In addition, an interlayer insulation film 103 is formed by using a silicon oxide film produced by plasma CVD.

Figure 6:
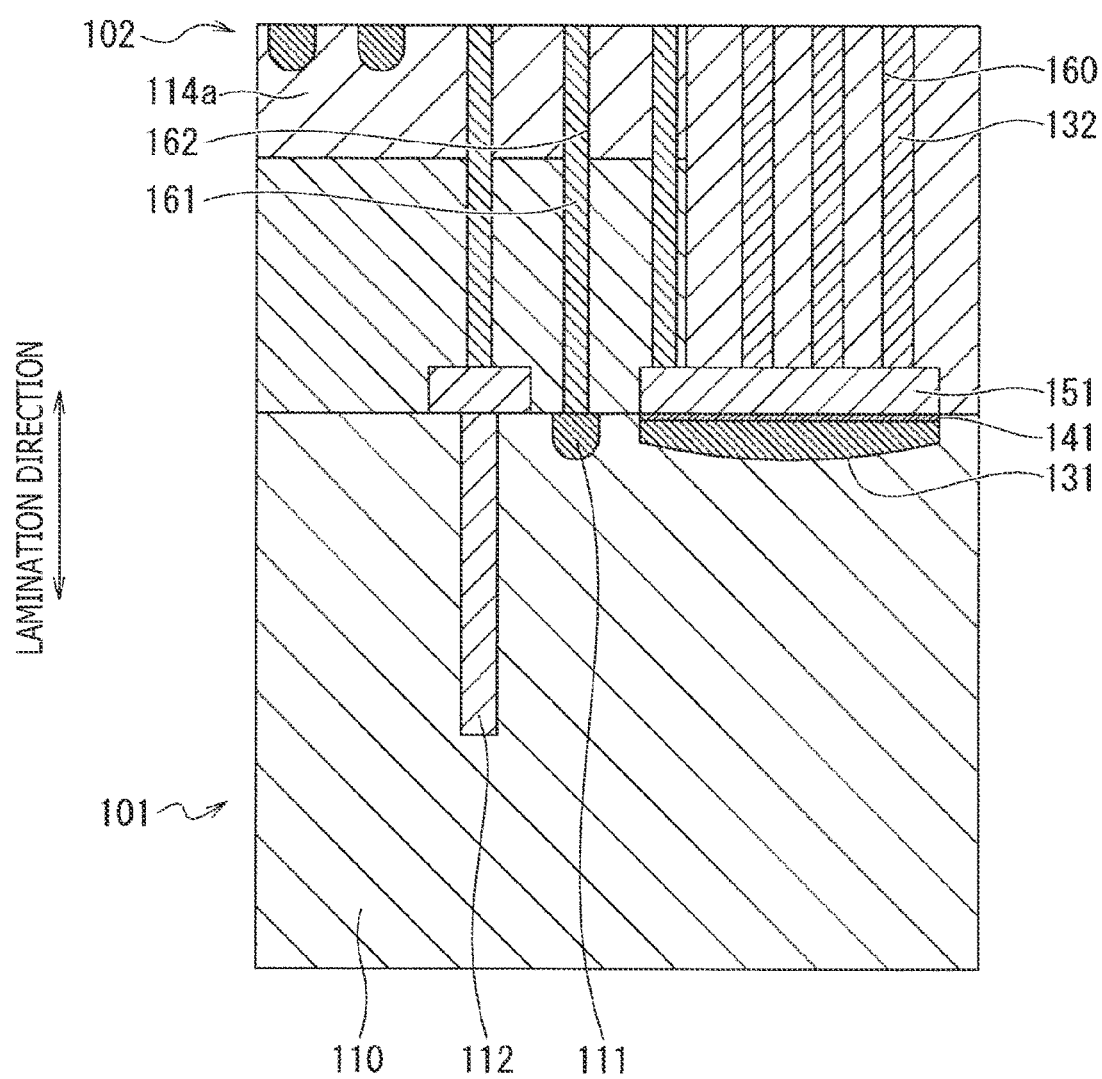
FIG. 6 is a cross-sectional diagram depicting the solid-state imaging element manufacturing method according to the first embodiment.

Then, as depicted in FIG. 6, the second semiconductor substrate 102 formed by using an epitaxial film is laminated on a surface of the interlayer insulation film 103 (upper surface in FIG. 6) on the side opposite to a surface facing the first semiconductor substrate 101.

Thereafter, a source-drain region 114a of the amplification transistor 114 is formed in a pixel transistor region defined at a position different from a position of a capacitor region, by ion-implanting phosphorus or arsenic using an ion implantation method. Subsequently, the second contact hole 162 connected to the floating diffusion 111 is opened by a plasma etching method from a surface of the second semiconductor substrate 102 (upper surface in FIG. 6) on the side opposite to a surface facing the interlayer insulation film 103. In addition, the first contact hole 160 connected to the second electrode 151 is opened.

Further, a high melting metal is formed inside the second contact hole 162 and inside the first contact hole 160 by sputtering to simultaneously form the FD side wiring electrode 161 and the third electrode 132.

Figure 7:
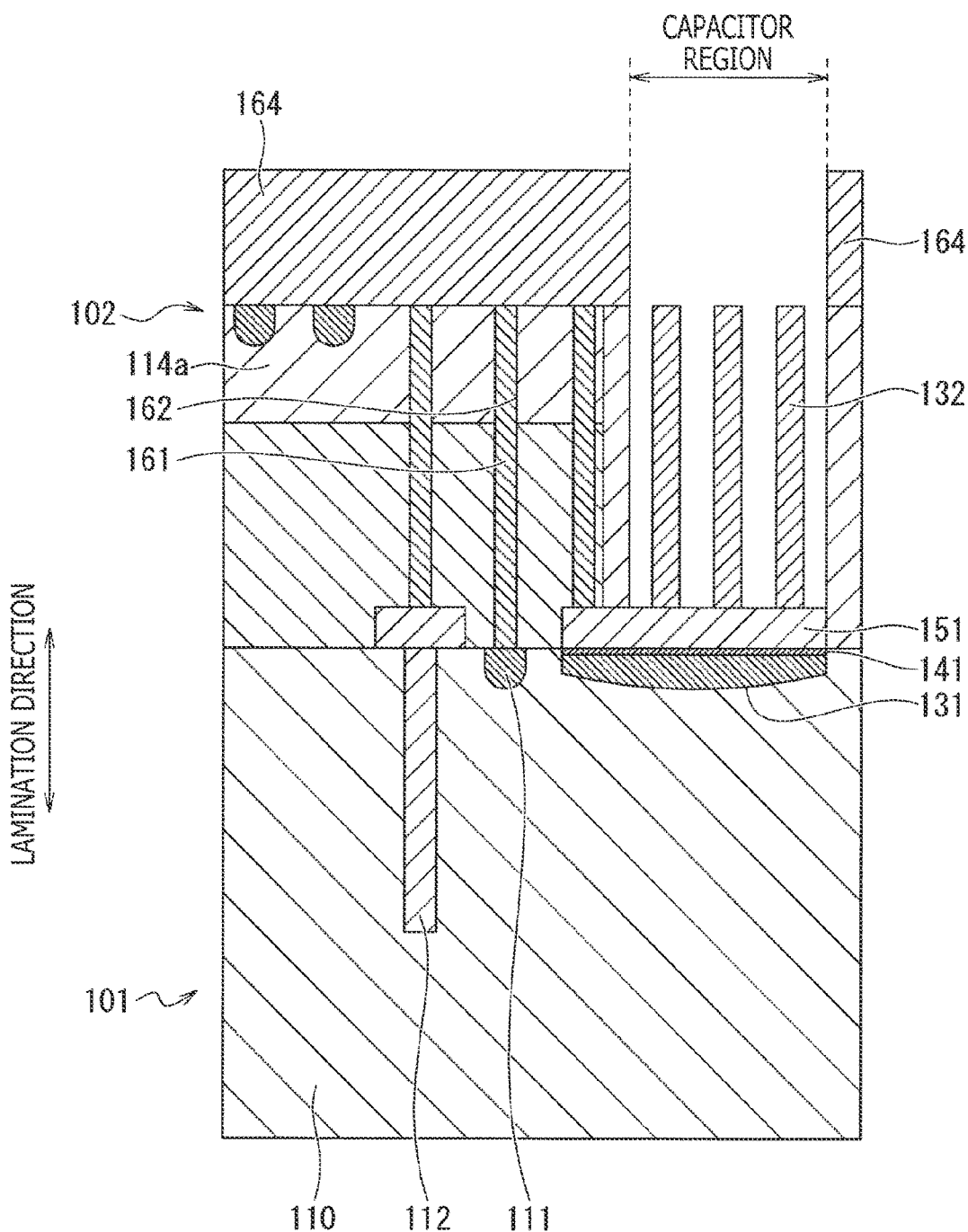
FIG. 7 is a cross-sectional diagram depicting the solid-state imaging element manufacturing method according to the first embodiment.

Then, as depicted in FIG. 7, a film of a resist 164 having an opening at a portion corresponding to the capacitor region is formed on a surface of the second semiconductor substrate 102 (upper surface in FIG. 7) on the side opposite to a surface facing the interlayer insulation film 103. Further, a portion that is included in the interlayer insulation film 103 and corresponds to the capacitor region is removed by a plasma etching method to expose the third electrode 132. Thereafter, the resist 164 is removed.

Figure 8:
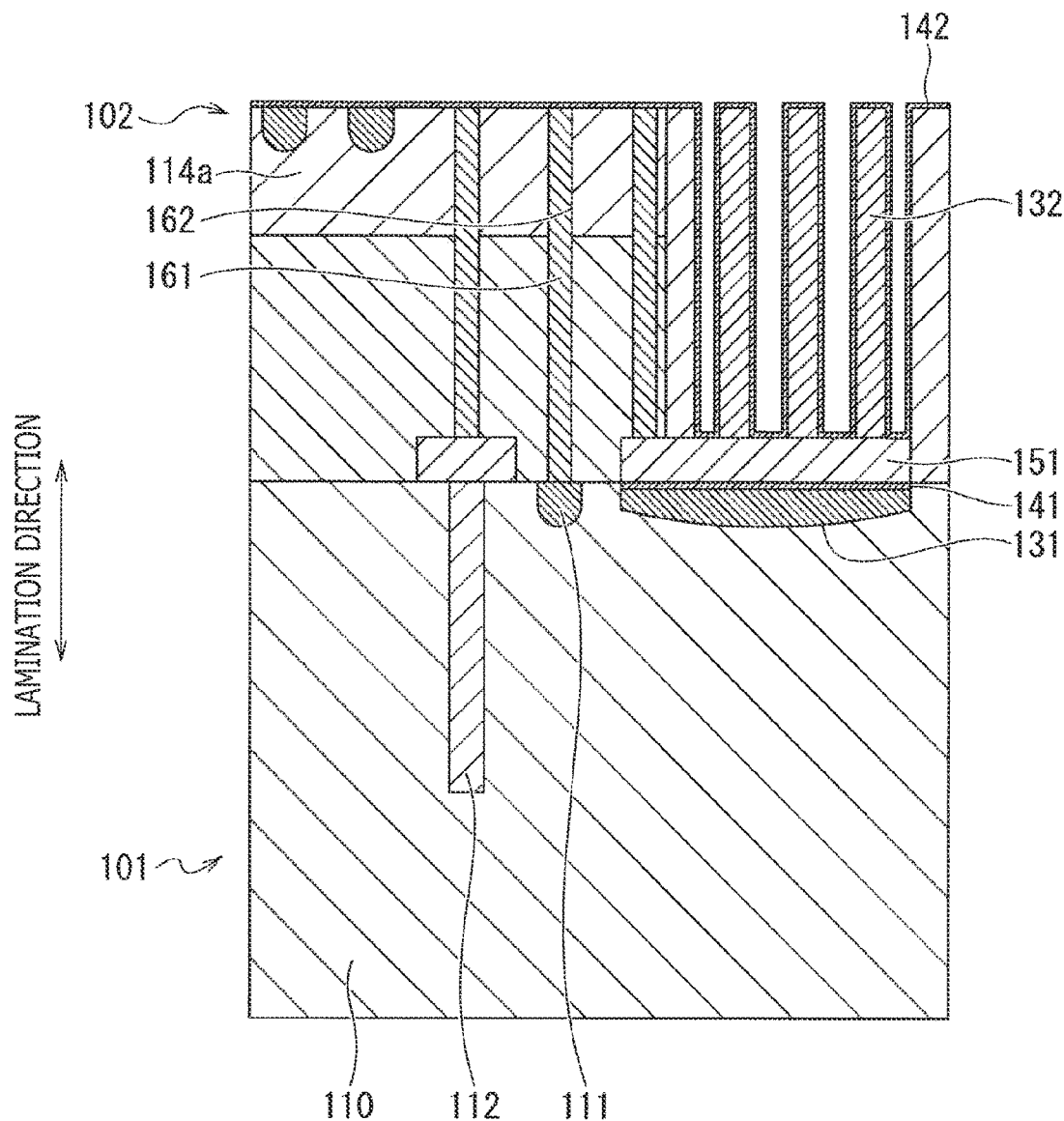
FIG. 8 is a cross-sectional diagram depicting the solid-state imaging element manufacturing method according to the first embodiment.

Subsequently, as depicted in FIG. 8, the second dielectric film 142 is formed by plasma CVD by using a ferroelectric film formed at such a position as to cover a portion of the third electrode 132 other than a connection portion between the third electrode 132 and the second electrode 151.

Figure 9:
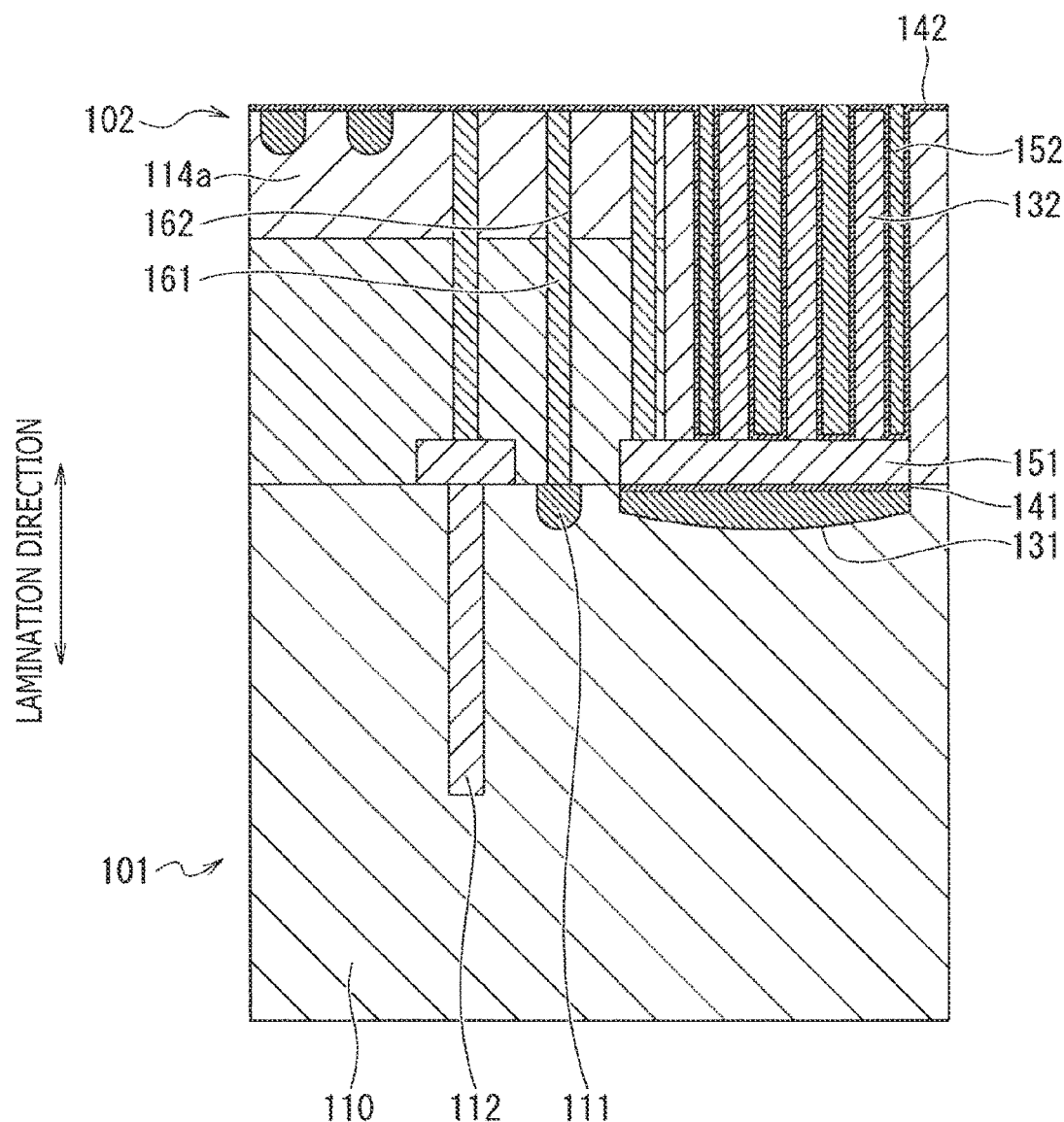
FIG. 9 is a cross-sectional diagram depicting the solid-state imaging element manufacturing method according to the first embodiment.

Thereafter, as depicted in FIG. 9, the fourth electrode 152 is formed by sputtering using a high melting metal at a position facing the third electrode with the second dielectric film 142 interposed between the fourth electrode 152 and the third electrode, to form the second capacitor portion 122. As described above, the solid-state imaging element manufacturing method includes a step of forming the capacitor 120 which has the PD side electrode 130, the dielectric film 140, and opposite PD side electrode 150.

In addition, according to the solid-state imaging element manufacturing method, the step of forming the capacitor includes a step of simultaneously forming the first contact hole 160 and the second contact hole 120 in the semiconductor substrate in such a shape as to extend in the thickness direction of the semiconductor substrate. In addition, according to the solid-state imaging element manufacturing method, the step of forming the capacitor includes a step of simultaneously forming the FD side wiring electrode 161 and the PD side electrode 130.

Figure 10:
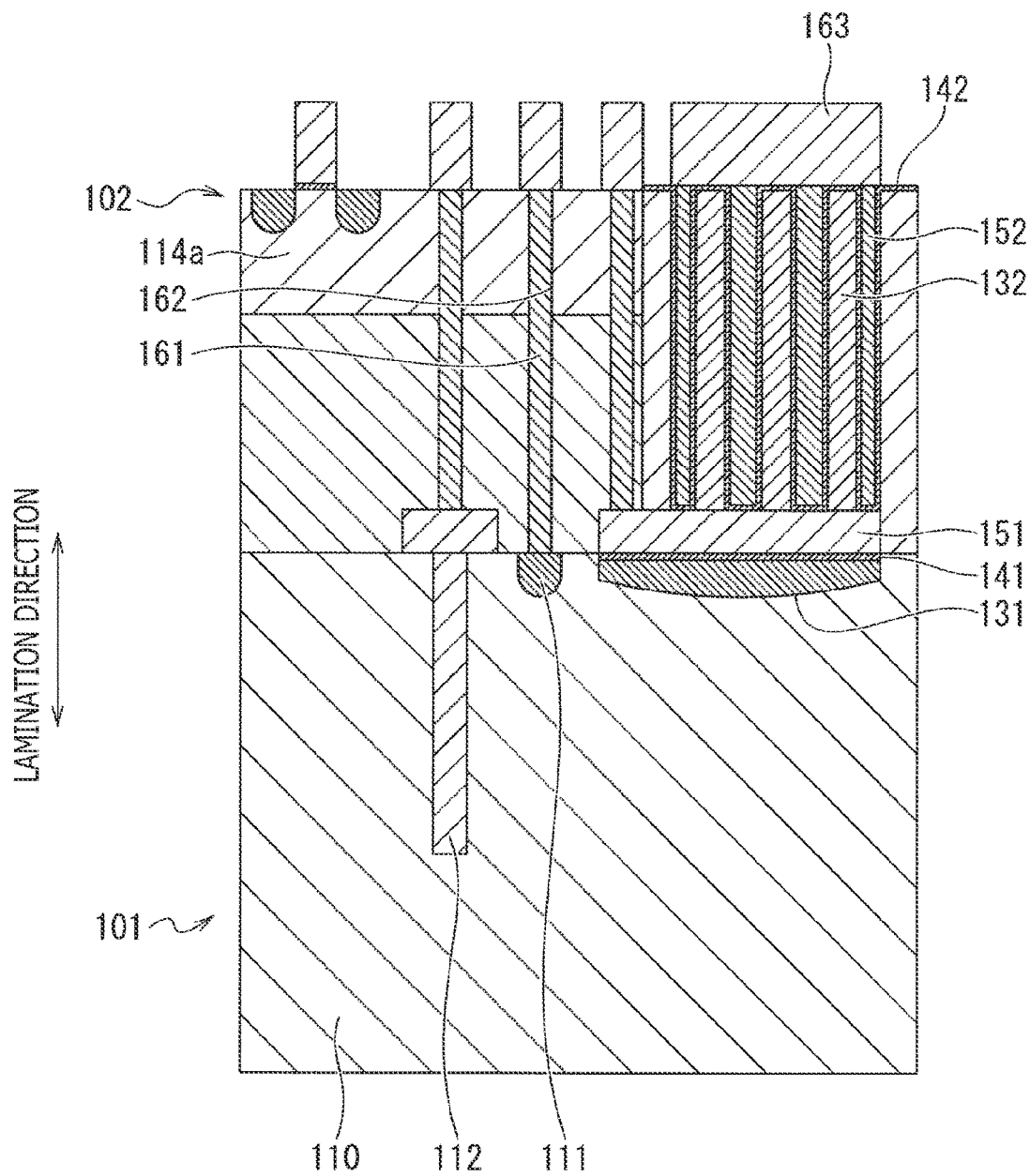
FIG. 10 is a cross-sectional diagram depicting the solid-state imaging element manufacturing method according to the first embodiment.

Then, as depicted in FIG. 10, a polycrystal silicon film is formed by thermal CVD on a surface of the second semiconductor substrate 102 on the side opposite to a surface facing the interlayer insulation film 103, to form the fifth electrode 163 constituting wiring in the pixel transistor region and the capacitor region. Accordingly, the solid-state imaging element manufacturing method includes a step of forming the amplification transistor 114.

According to the configuration of the first embodiment, at least a part of the PD side electrode 130 and the FD side wiring electrode 161 are formed in the same semiconductor substrate in such a shape as to extend in the thickness direction of the semiconductor substrate. In this manner, the FD side wiring electrode 161 and the third electrode 132 forming the PD side electrode 130 can simultaneously be formed. Accordingly, the solid-state imaging element provided herein can achieve reduction of the number of steps required for manufacturing.

In addition, according to the configuration of the first embodiment, the capacitor 120 has a configuration of lamination of the first capacitor portion 121 and the second capacitor portion 122. Accordingly, a capacity required for the capacitor 120 can easily be obtained even in a case of a configuration which has a smaller area for forming the capacitor 120 as a result of miniaturization of the solid-state imaging element.

Further, according to the configuration of the first embodiment, a dynamic range of the solid-state imaging element is expandable. This is achieved for the following reason.

In a case where the gate of the switch transistor 115 is turned off, a capacity decreases as a result of disconnection of the floating diffusion 111 from the capacitor 120. In addition, the floating diffusion 111 has a small capacity. In this case, a potential considerably decreases with a small quantity of electrons, and therefore, a highly sensitive signal is output. However, electrons overflow from the floating diffusion 111 at the time of a large quantity of signal electrons. In this case, it is difficult to obtain a proper signal corresponding to an amount of light entering the photodiode 110. On the other hand, in a case where the gate of the switch transistor 115 is turned on, a capacity increases as a result of connection of the floating diffusion 111 to the capacitor 120. When the capacity increases, a larger quantity of electrons are receivable. However, sensitivity lowers.

As described above, image synthesis for synthesizing an image formed by reading electric charges in a high-sensitive operation mode and an image formed by reading electric charges in a low-sensitive operation mode is achievable by switching the gate of the switch transistor 115. In this manner, the dynamic range of the solid-state imaging element is expandable.

Further, according to the configuration of the first embodiment, the step of forming the capacitor includes a step of simultaneously forming the first contact hole 160 and the second contact hole 120 in the semiconductor substrate in such a shape as to extend in the thickness direction of the semiconductor substrate. In addition, according to the solid-state imaging element manufacturing method, the step of forming the capacitor includes a step of simultaneously forming the FD side wiring electrode 161 and the PD side electrode 130. In this manner, the solid-state imaging element manufacturing method provided herein can achieve reduction of the number of steps required for manufacturing the solid-state imaging element.

Modification of First Embodiment

According to the first embodiment, the third electrode 132 and the fourth electrode 152 are each formed by using a high melting metal. However, the configuration is not limited thereto. For example, only either the third electrode 132 or the fourth electrode 152 may be formed by using a high melting metal.

According to the configuration of the first embodiment, the step of forming the capacitor includes the step of simultaneously forming the first contact hole 160 and the second contact hole 120 and the step of simultaneously forming the FD side wiring electrode 161 and the PD side electrode 130. However, the step of forming the capacitor is not limited thereto. Specifically, the step of forming the capacitor may include only the step of simultaneously forming the first contact hole 160 and the second contact hole 120. Similarly, the step of forming the capacitor may include only the step of simultaneously forming the FD side wiring electrode 161 and the PD side electrode 130.

SECOND EMBODIMENT

Figure 11:
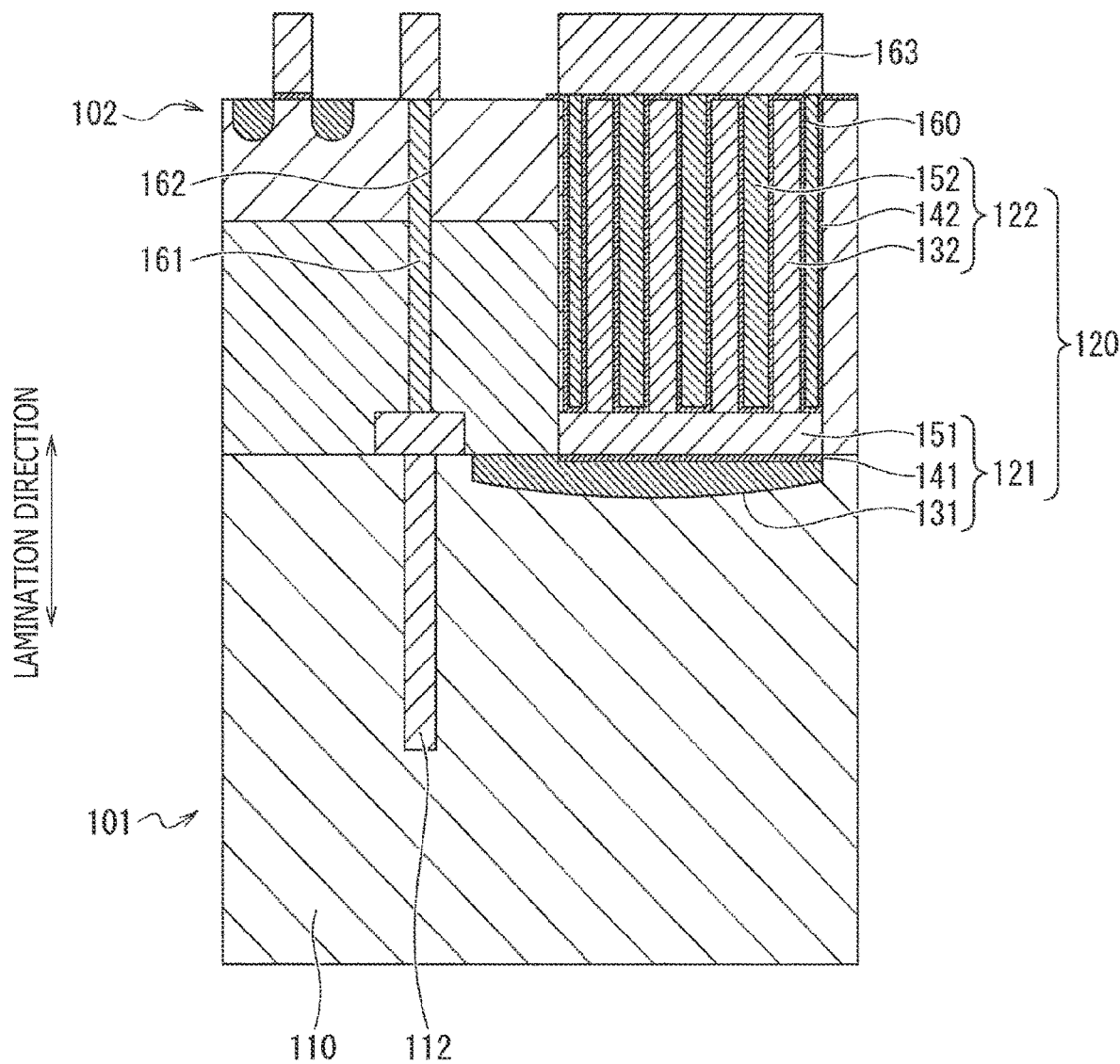
FIG. 11 is a cross-sectional diagram depicting a configuration of a semiconductor device according to a second embodiment.

A solid-state imaging element according to a second embodiment is different from that of the first embodiment in the configuration of the capacitor 120 and the configuration of the equivalent circuit as depicted in FIG. 11. In the following description, explanation of a part identical to the corresponding part in the first embodiment is omitted in some cases.

The capacitor 120 includes the first capacitor portion 121 and the second capacitor portion 122.

The first capacitor portion 121 is a capacitor formed in the first capacitor region defined in the first semiconductor substrate 101 beforehand.

The first capacitor region is defined at a position containing the floating diffusion 111 in the first semiconductor substrate 101.

The first capacitor portion 121 has the first electrode 131, the first dielectric film 141, and the second electrode 151.

The first dielectric film 141 is formed on a portion that is included in the first electrode 131 and that overlaps with the second electrode 151. In other words, the first electrode 131 has a portion not overlapping with the first dielectric film 141 and the second electrode 151 as viewed in a lamination direction where the first semiconductor substrate 101 and the second semiconductor substrate 102 are laminated (up-down direction in FIG. 11). Accordingly, a part of the first electrode 131 contains the floating diffusion 111.

In addition, according to the second embodiment, the equivalent circuit does not include the switch transistor 115. Accordingly, while not depicted in the figure, the floating diffusion 111 is formed at a point connecting the drain electrode of the transfer transistor 112, the source electrode of the reset transistor 113, the capacitor 120, and the gate electrode of the amplification transistor 114.

According to the configuration of the second embodiment, the FD side wiring electrode 161 and the third electrode 132 can simultaneously be formed similarly to the first embodiment. Accordingly, the solid-state imaging element provided herein can achieve reduction of the number of steps required for manufacturing.

In addition, according to the configuration of the second embodiment, the switch transistor 115 is eliminated. Accordingly, the solid-state imaging element provided herein can achieve simplification of the structure.

THIRD EMBODIMENT

Figure 12:
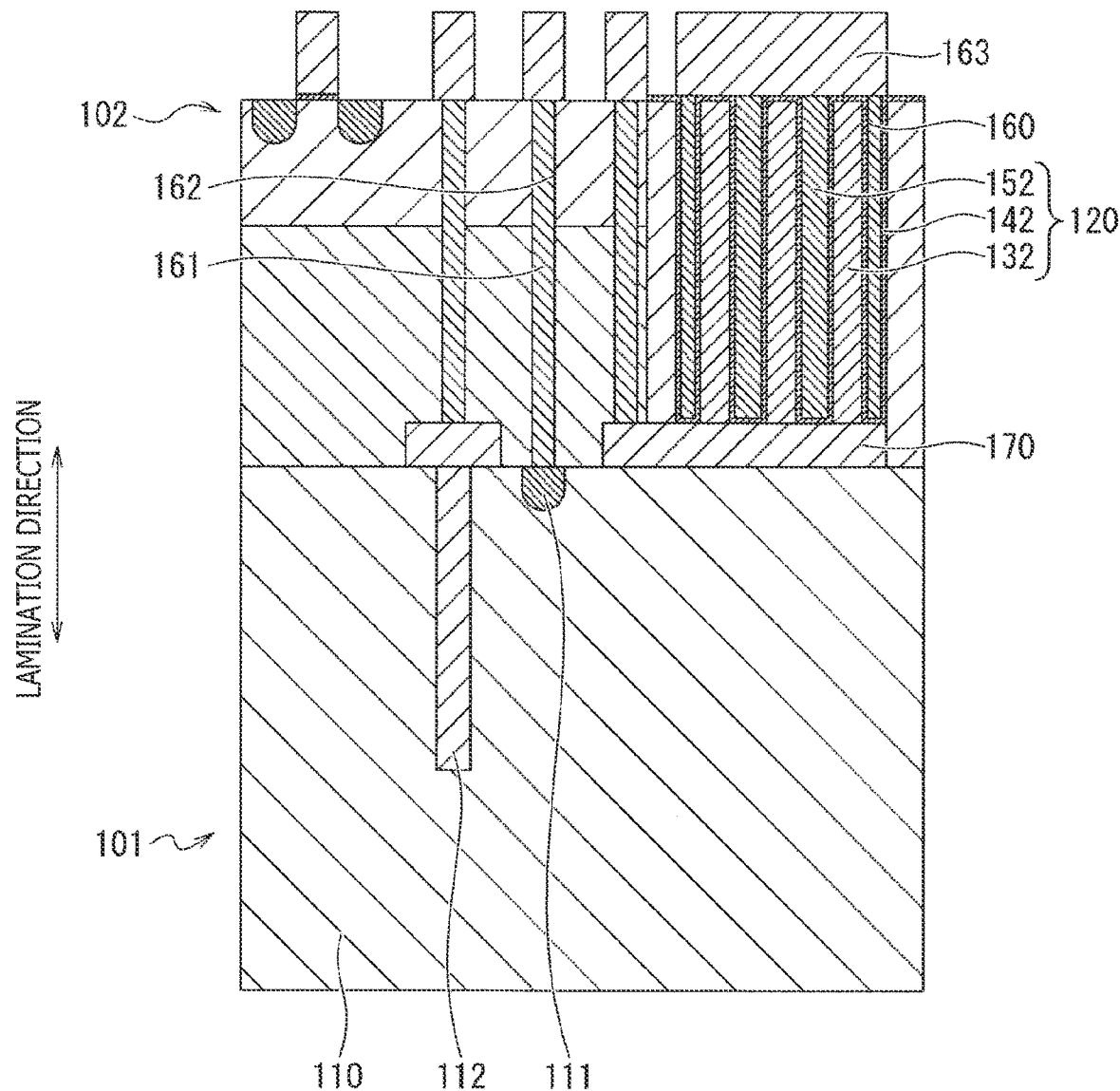
FIG. 12 is a cross-sectional diagram depicting a configuration of a semiconductor device according to a third embodiment.

As depicted in FIG. 12, a solid-state imaging element according to a third embodiment is different from that of the first embodiment in the configuration of the first semiconductor substrate 101 and the configuration of the capacitor 120. In the following description, explanation of a part identical to the corresponding part in the first embodiment is omitted in some cases.

The first semiconductor substrate 101 includes a placed electrode 170 laminated on the surface of the photodiode 110 (upper surface in FIG. 12) on the side opposite to the surface into which light enters.

For example, the placed electrode 170 is formed by using a polycrystal silicon film, for example.

The capacitor 120 has the PD side electrode 130, the dielectric film 140, and the opposite PD side electrode 150.

The PD side electrode 130 includes the third electrode 132.

The third electrode 132 is a column-shaped electrode which has one end (lower end in FIG. 12) connected to the placed electrode 170.

The dielectric film 140 includes the second dielectric film 142.

The second dielectric film 142 covers a portion of the third electrode 132 other than a connection portion between the third electrode 132 and the placed electrode 170.

The opposite PD side electrode 150 includes the fourth electrode 152.

The fourth electrode 152 is an electrode facing the third electrode 132 with the second dielectric film 142 interposed between the fourth electrode 152 and the third electrode 132.

According to the configuration of the third embodiment, the FD side wiring electrode 161 and the third electrode 132 can simultaneously be formed similarly to the first embodiment. Accordingly, the solid-state imaging element provided herein can achieve reduction of the number of steps required for manufacturing.

In addition, according to the configuration of the third embodiment, the number of electrodes forming the capacitor 120 is smaller than that in each of the first embodiment and the second embodiment. Accordingly, the solid-state imaging element provided herein can achieve simplification of the structure. In addition, the solid-state imaging element provided herein can achieve reduction of the number of steps required for manufacturing.

FOURTH EMBODIMENT

Figure 13:
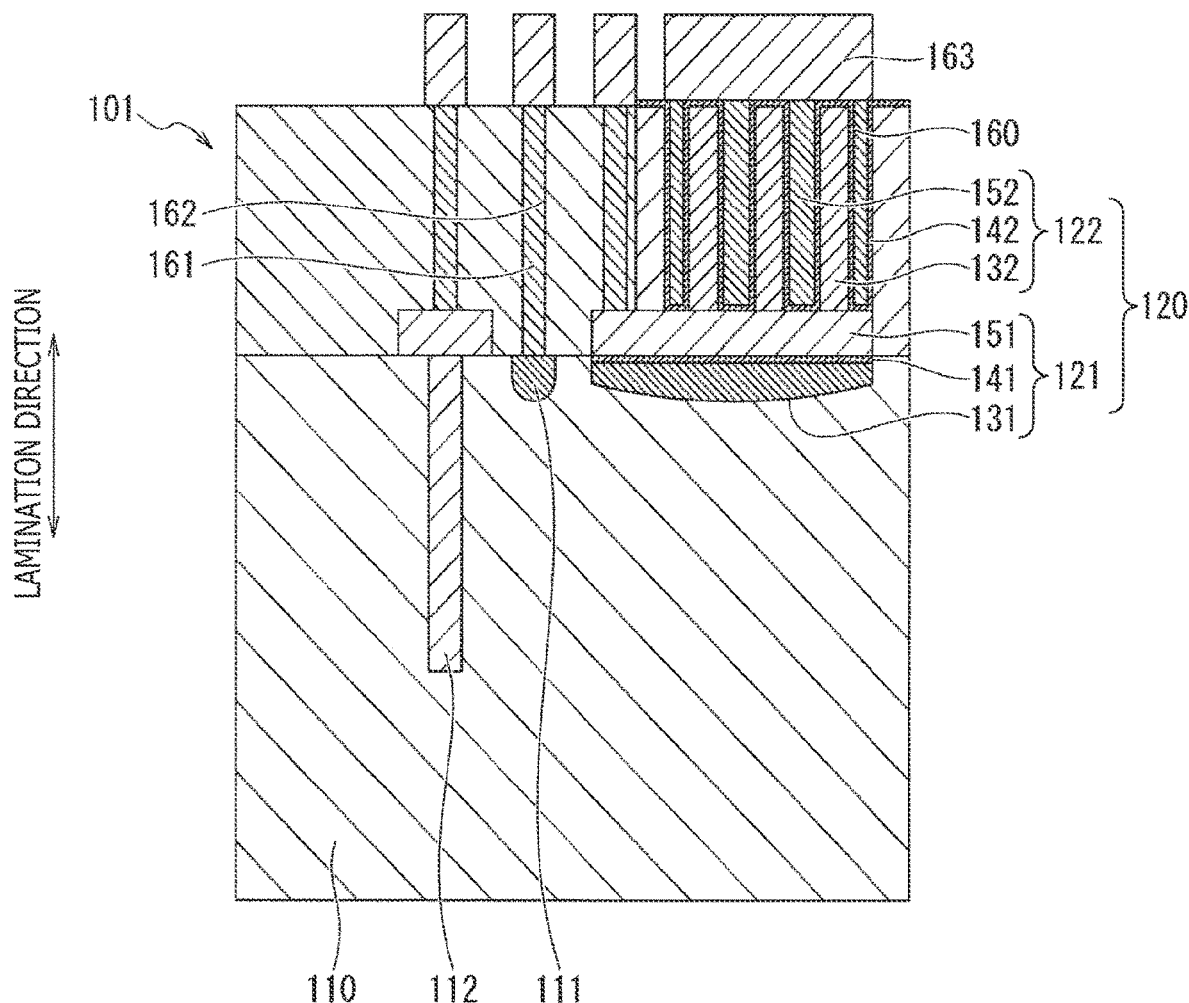
FIG. 13 is a cross-sectional diagram depicting a configuration of a semiconductor device according to a fourth embodiment.

As depicted in FIG. 13, a solid-state imaging element according to a fourth embodiment is different from that of the first embodiment in the configuration that the semiconductor substrate does not include the second semiconductor substrate but includes only the first semiconductor substrate 101. In the following description, explanation of a part identical to the corresponding part in the first embodiment is omitted in some cases.

Accordingly, the whole of the third electrode 132 forming the PD side electrode 130 is formed in the first semiconductor substrate 101 in the fourth embodiment. In addition, the whole of the second dielectric film 142 forming the dielectric film 140 is formed in the first semiconductor substrate 101. Further, the whole of the FD side wiring electrode 161 is formed in the first semiconductor substrate 101.

In addition, according to the fourth embodiment, the fifth electrode 163 is provided on a surface of the first semiconductor substrate 101 (upper surface in FIG. 13) on the side opposite to the photodiode 110 side.

According to the configuration of the fourth embodiment, the FD side wiring electrode 161 and the third electrode 132 can simultaneously be formed similarly to the first embodiment. Accordingly, the solid-state imaging element provided herein can achieve reduction of the number of steps required for manufacturing.

In addition, according to the configuration of the fourth embodiment, the semiconductor substrate includes only the first semiconductor substrate 101. Accordingly, the solid-state imaging element provided herein allows more configuration variations.

FIFTH EMBODIMENT

Figure 14:
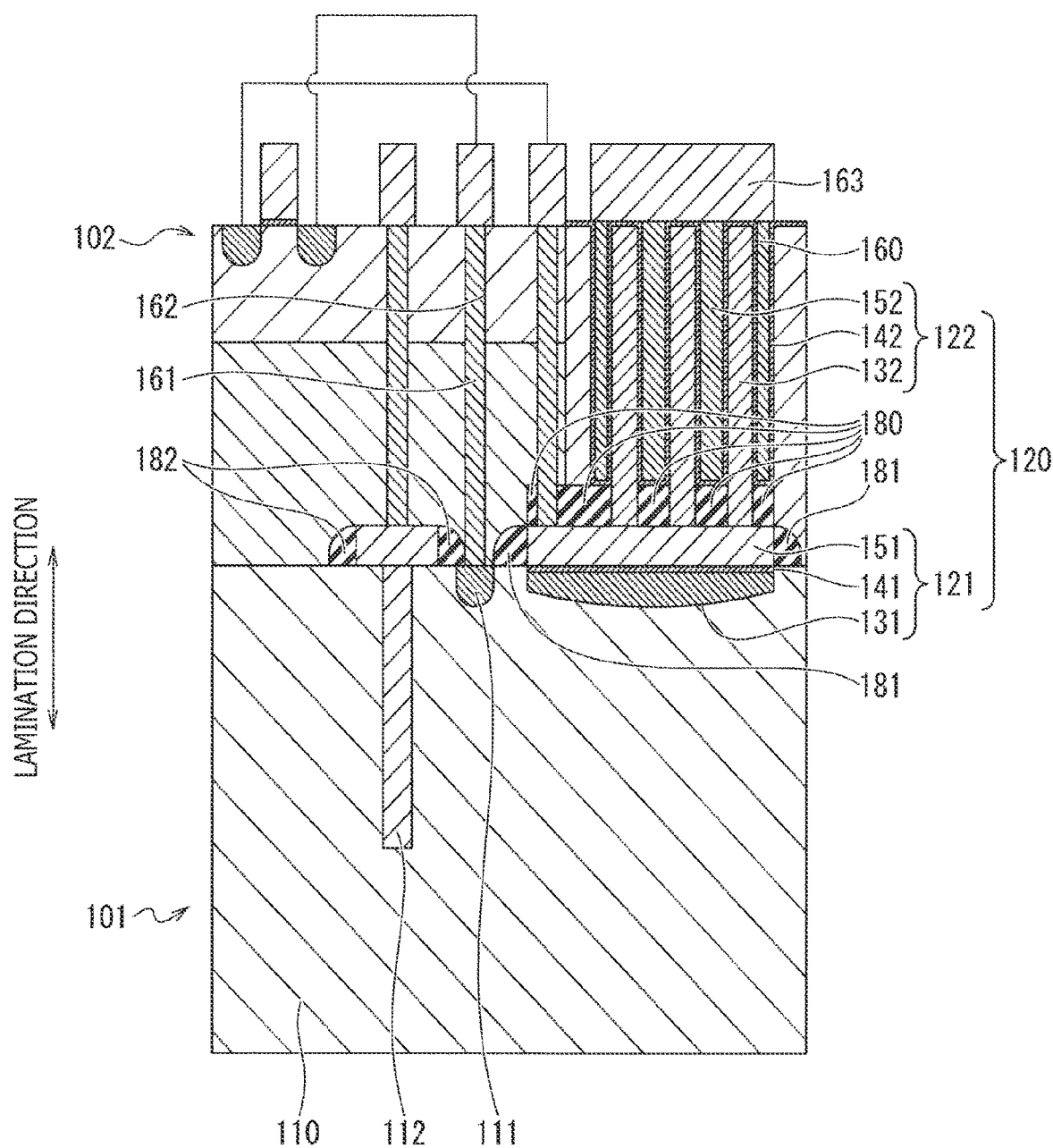
FIG. 14 is a cross-sectional diagram depicting a configuration of a semiconductor device according to a fifth embodiment.

As depicted in FIG. 14, a solid-state imaging element according to a fifth embodiment is different from that of the first embodiment in the configuration of the capacitor 120 and the configuration of the second semiconductor substrate 102. In the following description, explanation of a part identical to the corresponding part in the first embodiment is omitted in some cases.

The capacitor 120 includes the first capacitor portion 121 and the second capacitor portion 122.

The first capacitor portion 121 is a capacitor formed in the first capacitor region defined in the first semiconductor substrate 101 beforehand.

The first capacitor region is defined at a position different from the position of the floating diffusion 111 in the first semiconductor substrate 101.

The first capacitor portion 121 has the first electrode 131, the first dielectric film 141, and the second electrode 151.

The first electrode 131 is an electrode disposed on the surface of the photodiode 110 in the first capacitor region on the side opposite to a surface into which light enters. The first electrode 131 and the floating diffusion 111 are provided apart from each other.

The first dielectric film 141 is laminated on the first electrode 131.

The second electrode 151 is laminated on the first dielectric film 141.

The second capacitor portion 122 is a capacitor disposed on the surface of the first capacitor portion 121 on the side opposite to the photodiode 110 side.

The second capacitor portion 122 has the third electrode 132, the second dielectric film 142, and the fourth electrode 152.

The third electrode 132 is a column-shaped electrode which forms the PD side electrode 130 and which has one end (lower end in FIG. 14) connected to the second electrode 151.

In addition, a side surface of a lower part of the third electrode 132 is in contact with an inter-capacitor insulation film 180 described below.

The second dielectric film 142 forms the dielectric film 140 and covers a pre-defined portion that is included in the third electrode 132 and that contains the other end of the third electrode 132 (upper end in FIG. 14).

The fourth electrode 152 is an electrode that forms the opposite PD side electrode 150 and that faces the third electrode 132 with the second dielectric film 142 interposed between the fourth electrode 152 and the third electrode 132.

The second semiconductor substrate 102 includes the inter-capacitor insulation film 180, a first side wall insulation film 181, and a second side wall insulation film 182.

The inter-capacitor insulation film 180 is provided between the second electrode 151 and the second dielectric film 142.

In addition, the inter-capacitor insulation film 180 is formed by using a material different from the material of the second dielectric film 142.

For example, an oxide film or a nitride film is adoptable as the material forming the inter-capacitor insulation film 180. In addition, for example, an oxide film or a nitride film having a single layer is used for forming the inter-capacitor insulation film 180.

Described in the fifth embodiment as one example will be a case where the inter-capacitor insulation film 180 is formed by using a single-layer oxide film on an assumption of a configuration where the second dielectric film 142 is formed by using a material other than an oxide film.

In addition, a part that is included in the third electrode 132 and contains one end of the third electrode 132 is inserted into the inter-capacitor insulation film 180.

Accordingly, the pre-defined portion included in the third electrode 132 and covered by the second dielectric film 142 is a portion of the third electrode 132 other than the part (the part inserted into the inter-capacitor insulation film 180).

The first side wall insulation film 181 is provided on a side surface of the second electrode 151 and formed by using the same material as that of the inter-capacitor insulation film 180.

Accordingly, described in the fifth embodiment as one example will be a case where the first side wall insulation film 181 is formed by using a single-layer oxide film.

Note that the first side wall insulation film 181 may be formed by using a nitride film. In this case, the first side wall insulation film 181 is formed by using a single-layer nitride film, for example.

The second side wall insulation film 182 is provided on a side surface of the transfer transistor 112 and formed by using the same material as that of the inter-capacitor insulation film 180.

Accordingly, described in the fifth embodiment as one example will be a case where the second side wall insulation film 182 is formed by using a single-layer oxide film.

Note that the second side wall insulation film 182 may be formed by using a nitride film. In this case, the second side wall insulation film 182 is formed by using a single-layer nitride film, for example.

<Solid-State Imaging Element Manufacturing Method>

A manufacturing method for manufacturing the solid-state imaging element of the fifth embodiment will be described with reference to FIGS. 15 to 22 along with FIG. 14.

Figure 15:
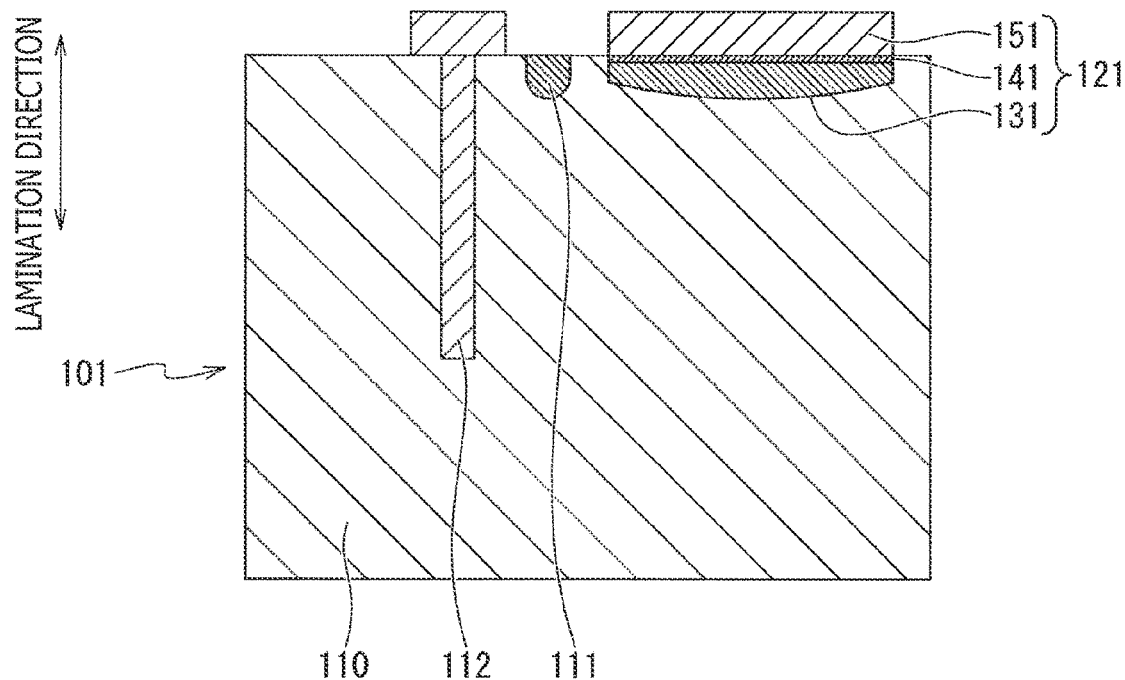
FIG. 15 is a cross-sectional diagram depicting a solid-state imaging element manufacturing method according to the fifth embodiment.

According to the solid-state imaging element manufacturing method, the photodiode 110, the floating diffusion 111, and the transfer transistor 112 are first produced on the first semiconductor substrate 101 formed by using silicon, as depicted in FIG. 15.

In addition, an N+ region is formed by ion-implanting phosphorus or arsenic in a capacitor region, which is a region defined in the first semiconductor substrate 101 beforehand, by using an ion implantation method.

Subsequently, a gate oxide film of the transfer transistor 112 is formed. In addition, the first dielectric film 141 laminated on the N+ region is formed on an upper surface of the N+ region by using a silicon oxide film formed by plasma CVD.

Thereafter, a gate electrode of the transfer transistor 112 is formed. In addition, the second electrode 151 laminated on the first dielectric film 141 is formed on a surface of the first dielectric film 141 (upper surface in FIG. 15) on the side opposite to a surface facing the N+ region, by using a polycrystal silicon film formed by thermal CVD.

Figure 16:
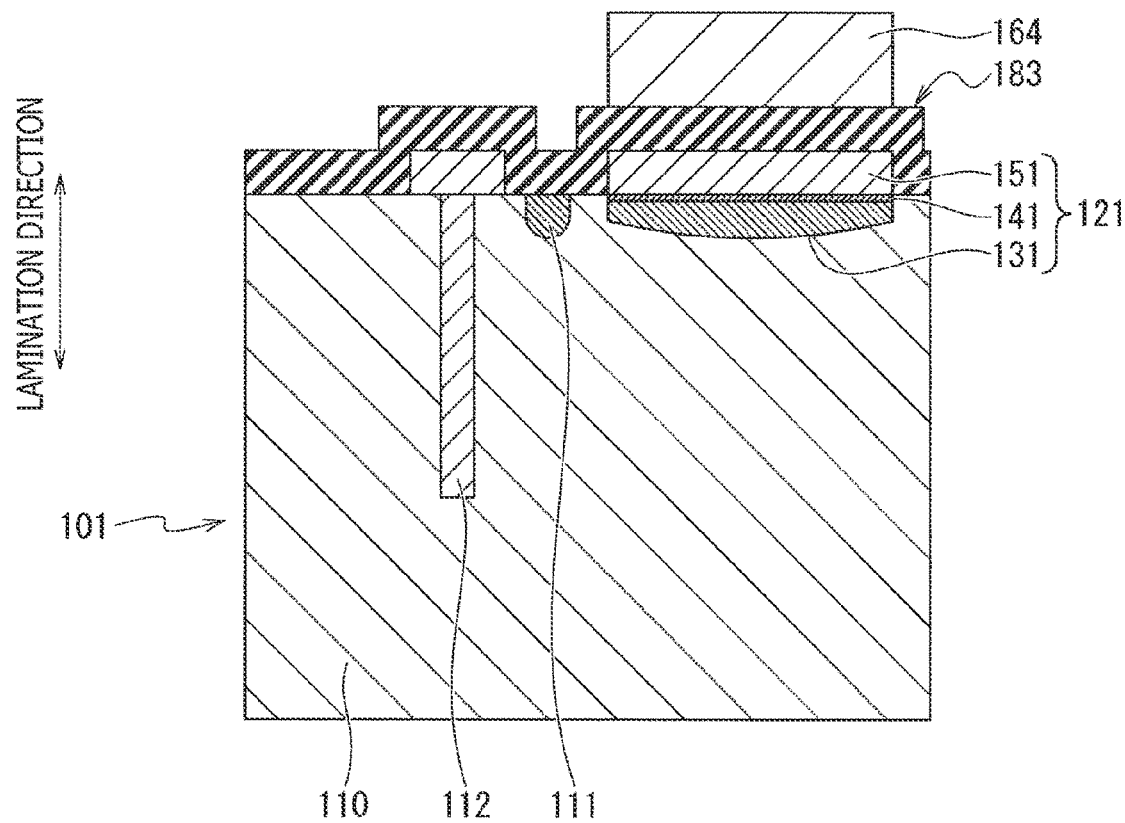
FIG. 16 is a cross-sectional diagram depicting the solid-state imaging element manufacturing method according to the fifth embodiment.

Further, as depicted in FIG. 16, an insulation forming film 183, which becomes the inter-capacitor insulation film 180, a first side wall insulation film 181, and a second side wall insulation film 182 later, is deposited in the transfer transistor 112 and the capacitor region. Thereafter, the resist 164 is formed in the capacitor region of the insulation forming film 183.

Figure 17:
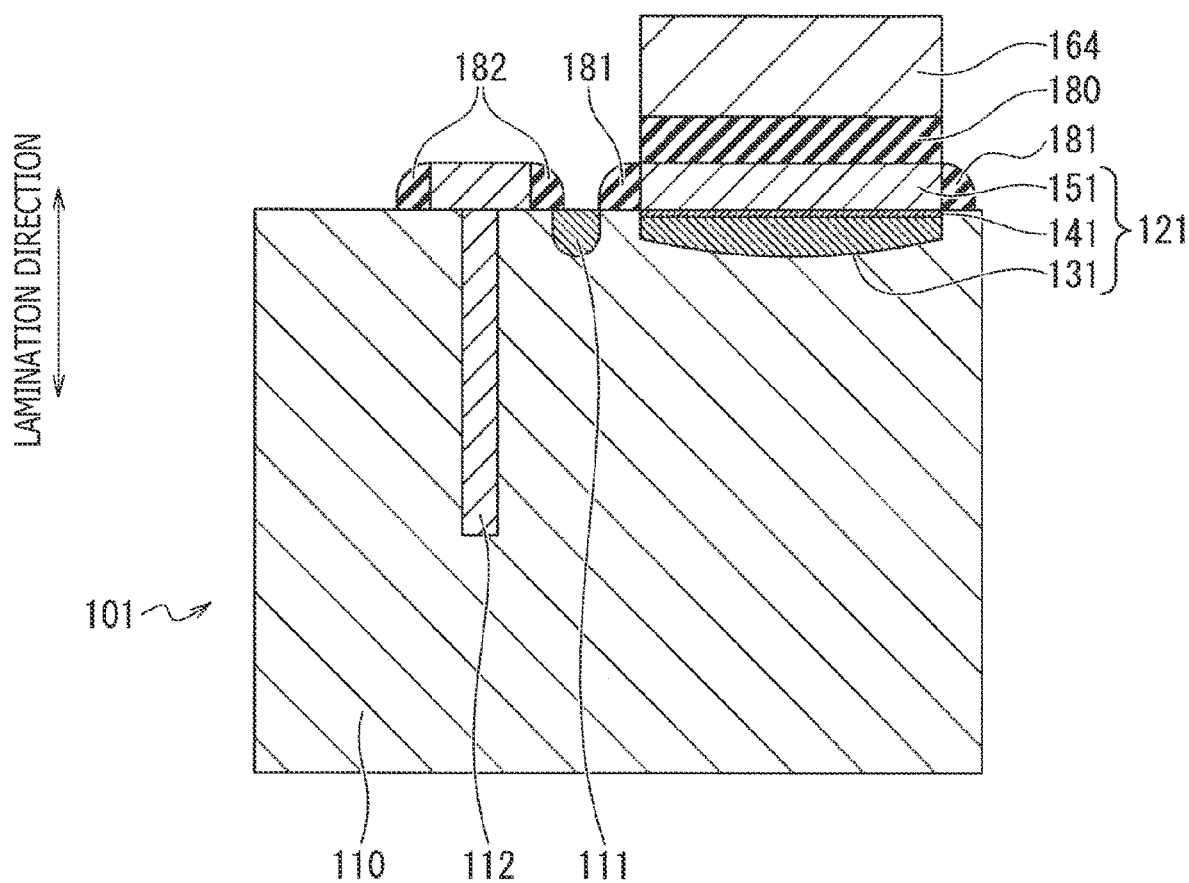
FIG. 17 is a cross-sectional diagram depicting the solid-state imaging element manufacturing method according to the fifth embodiment.

Subsequently, the insulation forming film 183 is etched to form the inter-capacitor insulation film 180, the first side wall insulation film 181, and the second side wall insulation film 182 as depicted in FIG. 17. In this case, the inter-capacitor insulation film 180 is deposited on the second electrode 151 in the state where the resist 164 has been formed on the capacitor region.

As described above, the solid-state imaging element manufacturing method includes a step of forming the inter-capacitor insulation film 180 between the second electrode 151 and the second dielectric film 142.

In addition, in the step of forming the inter-capacitor insulation film 180, a material different from the material of the second dielectric film 142 is used to form the inter-capacitor insulation film 180.

Further, the solid-state imaging element manufacturing method includes a step of forming the first side wall insulation film 181 formed on the side surface of the second electrode 151.

In addition, in the step of forming the first side wall insulation film 181, the same material as the material of the inter-capacitor insulation film 180 is used to form the first side wall insulation film 181.

In addition, in the step of forming the first side wall insulation film 181, an oxide film or a nitride film is used to form the first side wall insulation film 181.

Further, the solid-state imaging element manufacturing method includes a step of forming the second side wall insulation film 182 formed on the side surface of the transfer transistor 112.

In addition, in the step of forming the second side wall insulation film 182, the same material as the material of the inter-capacitor insulation film 180 is used to form the second side wall insulation film 182.

In addition, in the step of forming the second side wall insulation film 182, an oxide film or a nitride film is used to form the second side wall insulation film 182.

Figure 18:
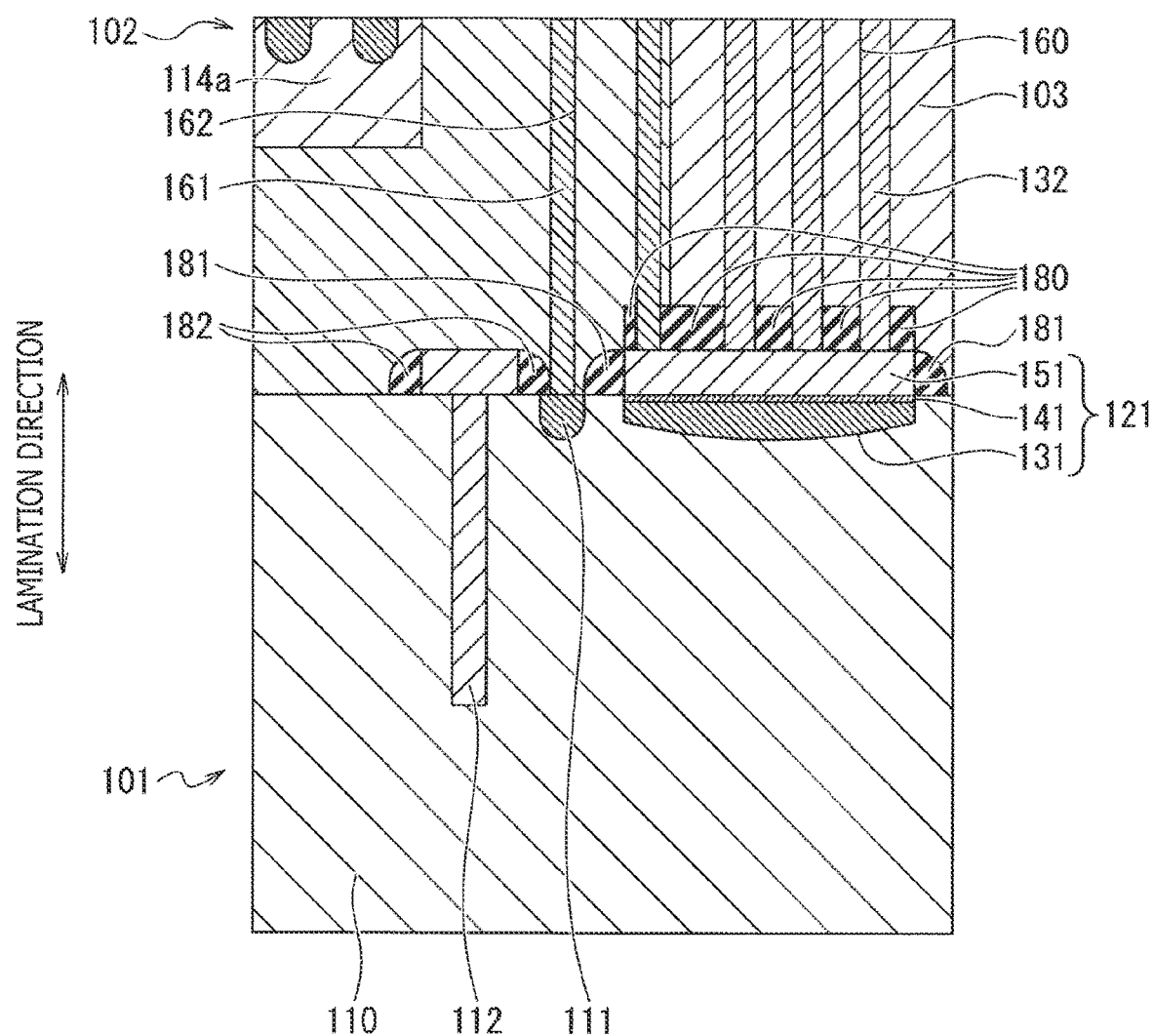
FIG. 18 is a cross-sectional diagram depicting the solid-state imaging element manufacturing method according to the fifth embodiment.

Subsequently, as depicted in FIG. 18, the interlayer insulation film 103 is formed by using a silicon oxide film produced by plasma CVD.

In addition, the second semiconductor substrate 102 formed by using an epitaxial film is laminated on a surface of the interlayer insulation film 103 (upper surface in FIG. 18) on the side opposite to a surface facing the first semiconductor substrate 101.

Thereafter, the source-drain region 114a of the amplification transistor 114 is formed in a pixel transistor region defined at a position different from a position of a capacitor region, by ion-implanting phosphorus or arsenic using an ion implantation method. Subsequently, the second contact hole 162 connected to the floating diffusion 111 is opened by plasma etching from a surface of the second semiconductor substrate 102 (upper surface in FIG. 18) on the side opposite to a surface facing the interlayer insulation film 103. In addition, the first contact hole 160 that penetrates the interlayer insulation film 103 and the inter-capacitor insulation film 180 and is connected to the second electrode 151 is opened.

Further, a high melting metal is formed inside the second contact hole 162 and inside the first contact hole 160 by sputtering to simultaneously form the FD side wiring electrode 161 and the third electrode 132.

In addition, in a step of forming the third electrode 132, the third electrode 132 is formed on the inter-capacitor insulation film 180, which has been formed in the step of forming the inter-capacitor insulation film 180, in a state where a part that is included in the third electrode 132 and contains one end of the third electrode 132 is inserted into the inter-capacitor insulation film 180.

Figure 19:
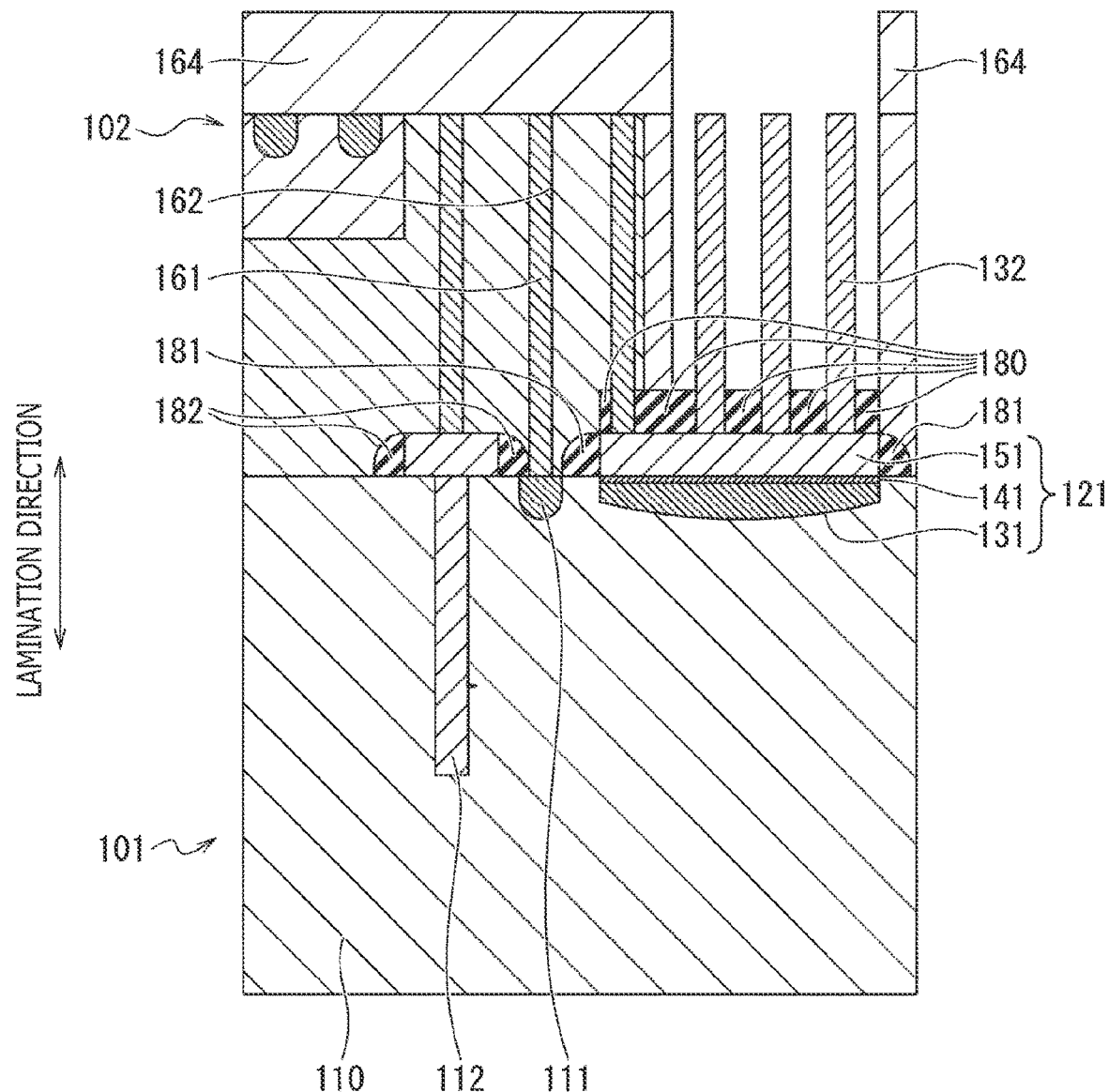
FIG. 19 is a cross-sectional diagram depicting the solid-state imaging element manufacturing method according to the fifth embodiment.

Then, as depicted in FIG. 19, a film of the resist 164 having an opening at a portion corresponding to the capacitor region is formed on a surface of the second semiconductor substrate 102 (upper surface in FIG. 19) on the side opposite to a surface facing the interlayer insulation film 103. Further, a portion that is included in the interlayer insulation film 103 and corresponds to the capacitor region is removed by plasma etching to expose the third electrode 132. Thereafter, the resist 164 is removed.

At this time, a selection etching condition is set such that an etching speed for the inter-capacitor insulation film 180 becomes lower than an etching speed for the interlayer insulation film 103. In this manner, the interlayer insulation film 103 formed on the capacitor region is etched while etching for the inter-capacitor insulation film 180 is reduced.

Figure 20:
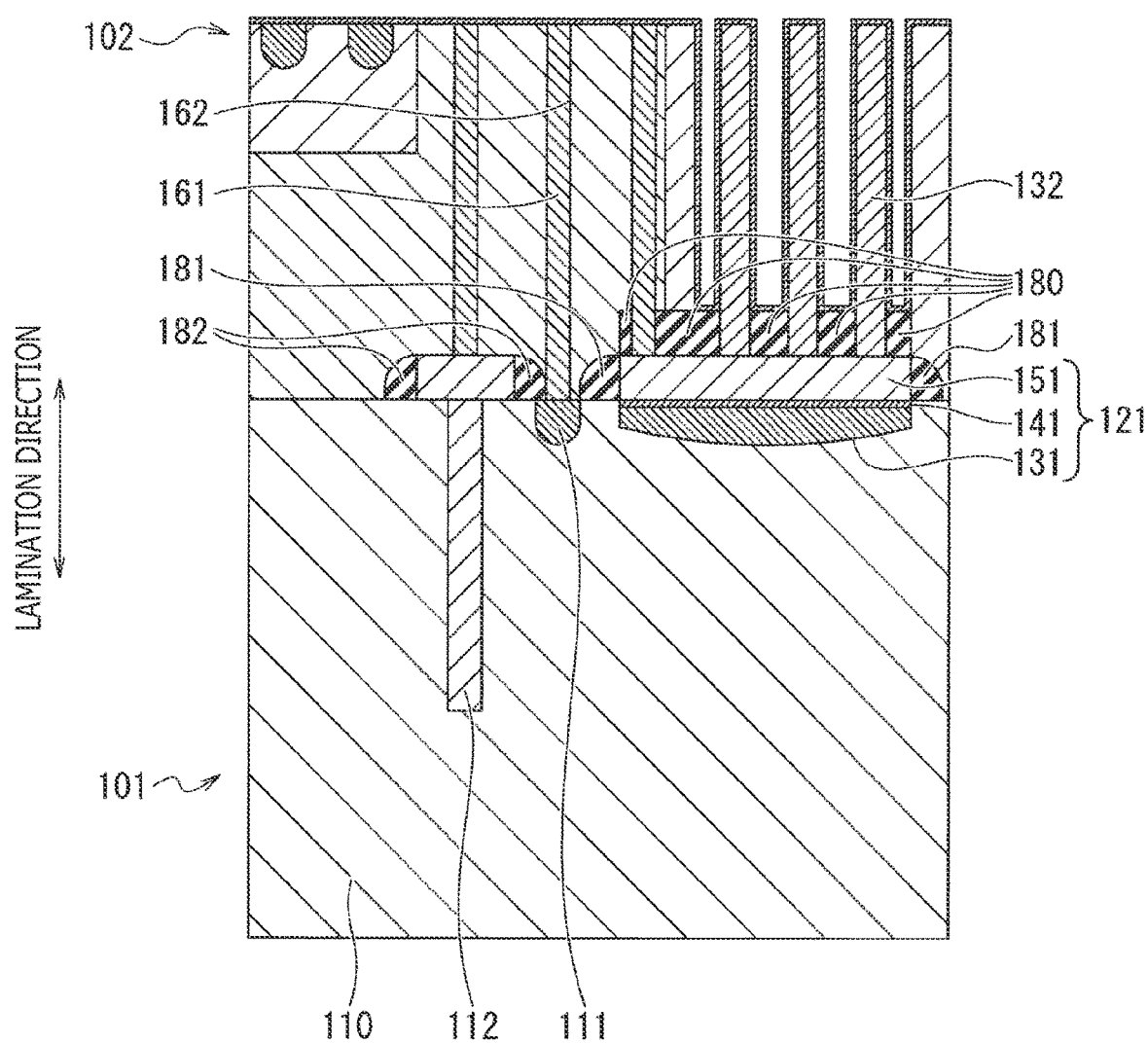
FIG. 20 is a cross-sectional diagram depicting the solid-state imaging element manufacturing method according to the fifth embodiment.

Subsequently, as depicted in FIG. 20, the second dielectric film 142 is formed by plasma CVD by using a ferroelectric film formed at such a position as to cover a portion that is included in the third electrode 132 and that is not inserted into the inter-capacitor insulation film 180.

Specifically, according to the solid-state imaging element manufacturing method, the step of forming the second capacitor portion 122 includes a step of forming the second dielectric film 142 covering the pre-defined portion that is included in the third electrode 132 and that contains the other end of the third electrode 132. In addition, in the step of forming the second dielectric film 142, a portion of the third electrode 132 other than a part is covered with the second dielectric film 142 as a pre-defined portion.

Figure 21:
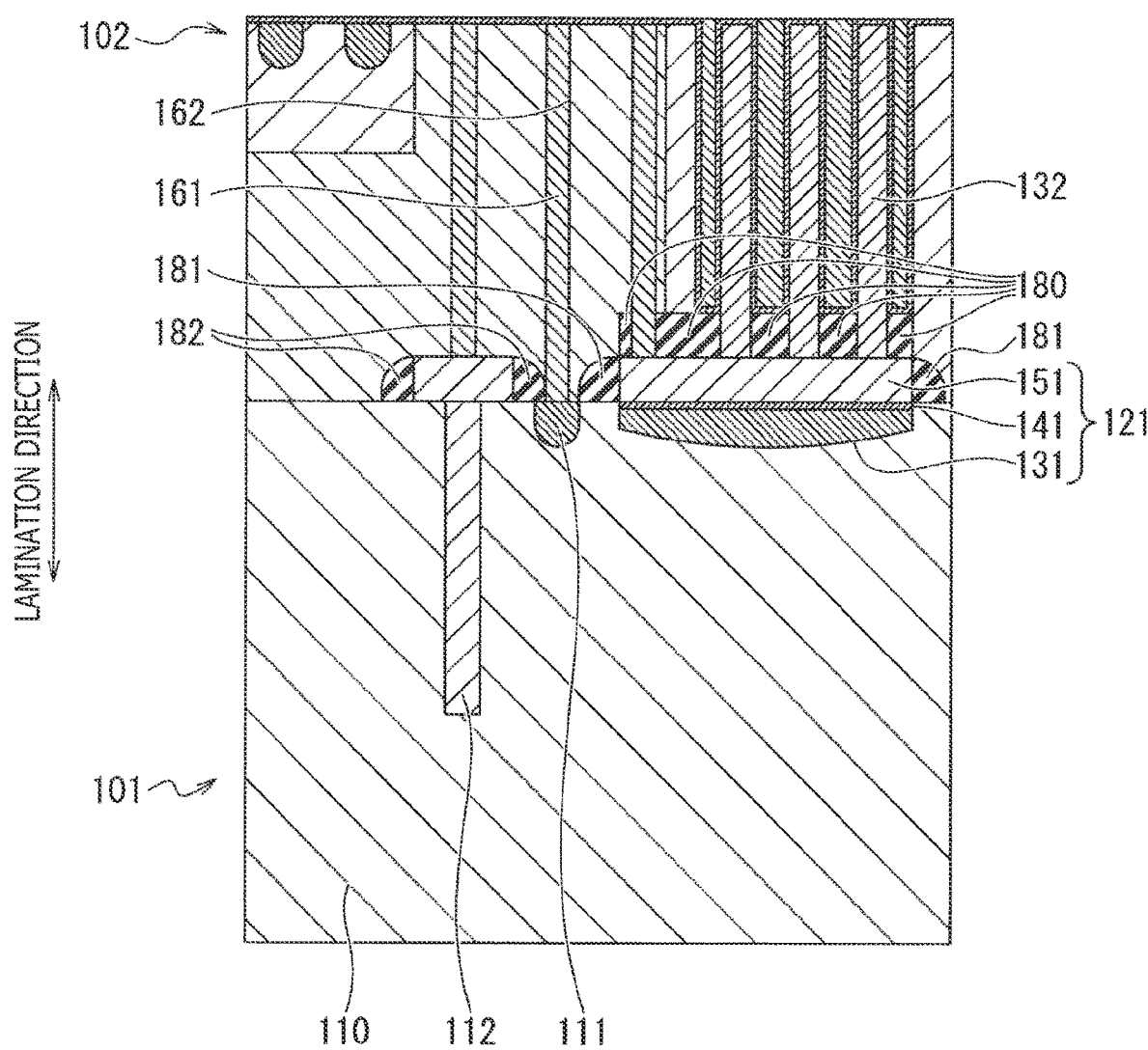
FIG. 21 is a cross-sectional diagram depicting the solid-state imaging element manufacturing method according to the fifth embodiment.

Thereafter, as depicted in FIG. 21, the fourth electrode 152 is formed by sputtering by using a high melting metal at a position facing the third electrode with the second dielectric film 142 interposed between the fourth electrode 152 and the third electrode, to form the second capacitor portion 122.

Figure 22:
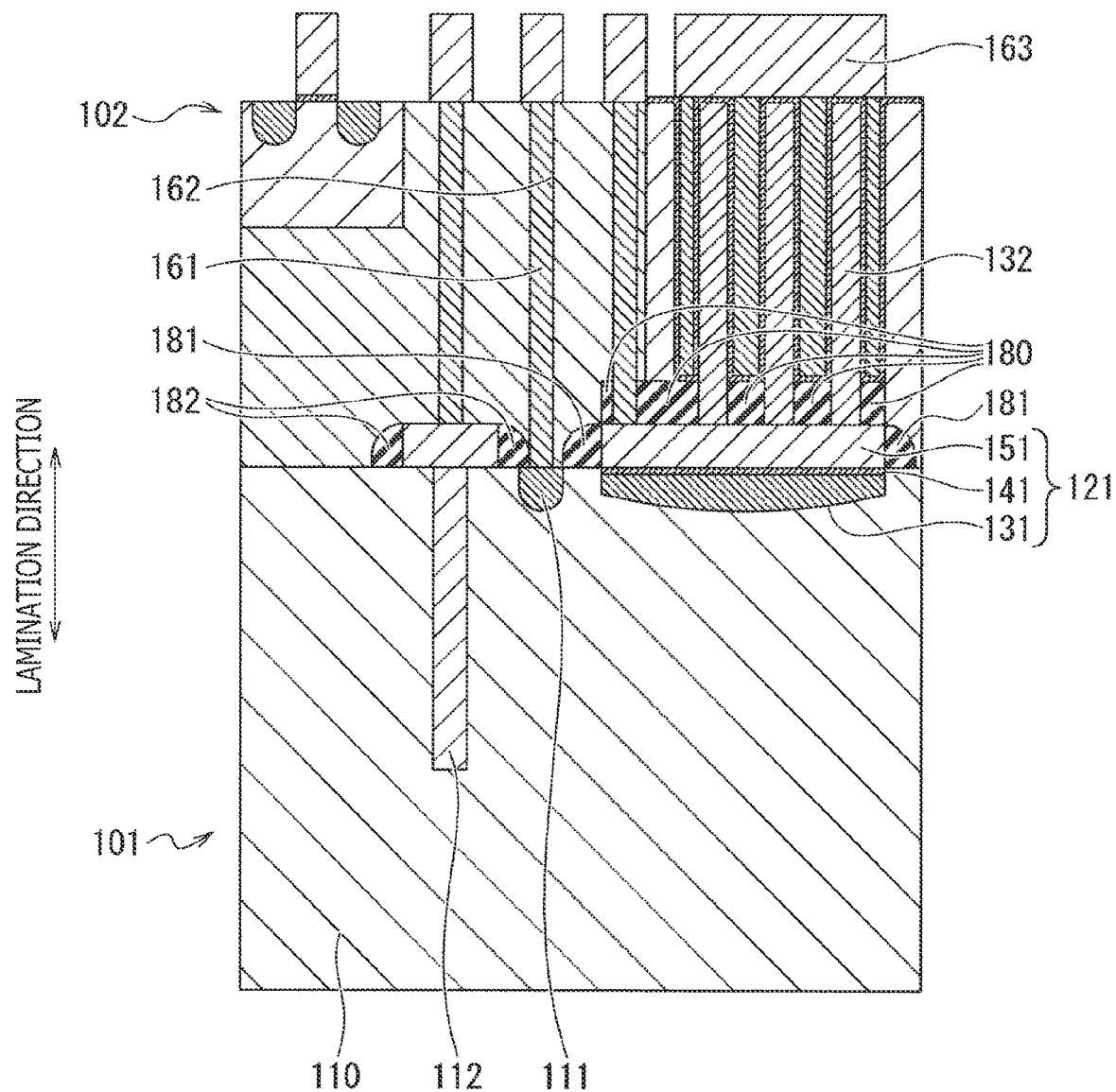
FIG. 22 is a cross-sectional diagram depicting the solid-state imaging element manufacturing method according to the fifth embodiment.

Then, as depicted in FIG. 22, a polycrystal silicon film is formed by thermal CVD on a surface of the second semiconductor substrate 102 on the side opposite to a surface facing the interlayer insulation film 103, to form the fifth electrode 163 constituting wiring in the pixel transistor region and the capacitor region.

According to the fifth embodiment, one end and a lower part of the third electrode 132 come into contact with the inter-capacitor insulation film 180. Accordingly, as depicted in FIG. 19, it is possible to increase a contact area between the third electrode 132 and the inter-capacitor insulation film 180 at the time of exposure of the third electrode 132 after removal of a part of the interlayer insulation film 103, in comparison with that area in each of the configurations of the first to the fourth embodiments. In this manner, it is possible to reduce a fall of the third electrode 132 in comparison with the configurations of the first to the fourth embodiments.

Specifically, when the third electrode 132 (conductive plug) is exposed in the step of forming the second capacitor portion 122, the contact area decreases in a state where only a bottom of the third electrode 132 is in contact with the second electrode in the configurations of the first to the fourth embodiments. In this case, the third electrode 132 falls as a result of penetration of cleaning solution used for removing the interlayer insulation film 103 of the capacitor region. On the other hand, when the third electrode 132 has a low cylindrical shape to reduce the height of the third electrode 132 and thereby prevent a fall of the third electrode 132, the area of the second capacitor portion 122 decreases. Accordingly, it is difficult to obtain a desired capacity.

However, the third electrode 132 is allowed to have a high cylindrical shape instead of a low cylindrical shape. Accordingly, the solid-state imaging element provided herein can achieve increase in the capacity while preventing reduction of the area of the second capacitor portion 122.

In addition, according to the configuration of the fifth embodiment, in the step of forming the third electrode 132, the third electrode 132 is formed on the inter-capacitor insulation film 180, which has been formed in the step of forming the inter-capacitor insulation film 180, in a state where a part that is included in the third electrode 132 and contains one end is inserted into the inter-capacitor insulation film 180. In this manner, the solid-state imaging element manufacturing method provided herein can achieve increase in the capacity while preventing reduction of the area of the second capacitor portion 122.

SIXTH EMBODIMENT

A solid-state imaging element according to a sixth embodiment is different from that of the fifth embodiment in the configuration of the inter-capacitor insulation film 180. In the following description, explanation of a part identical to the corresponding part in the fifth embodiment is omitted in some cases.

Figure 23:
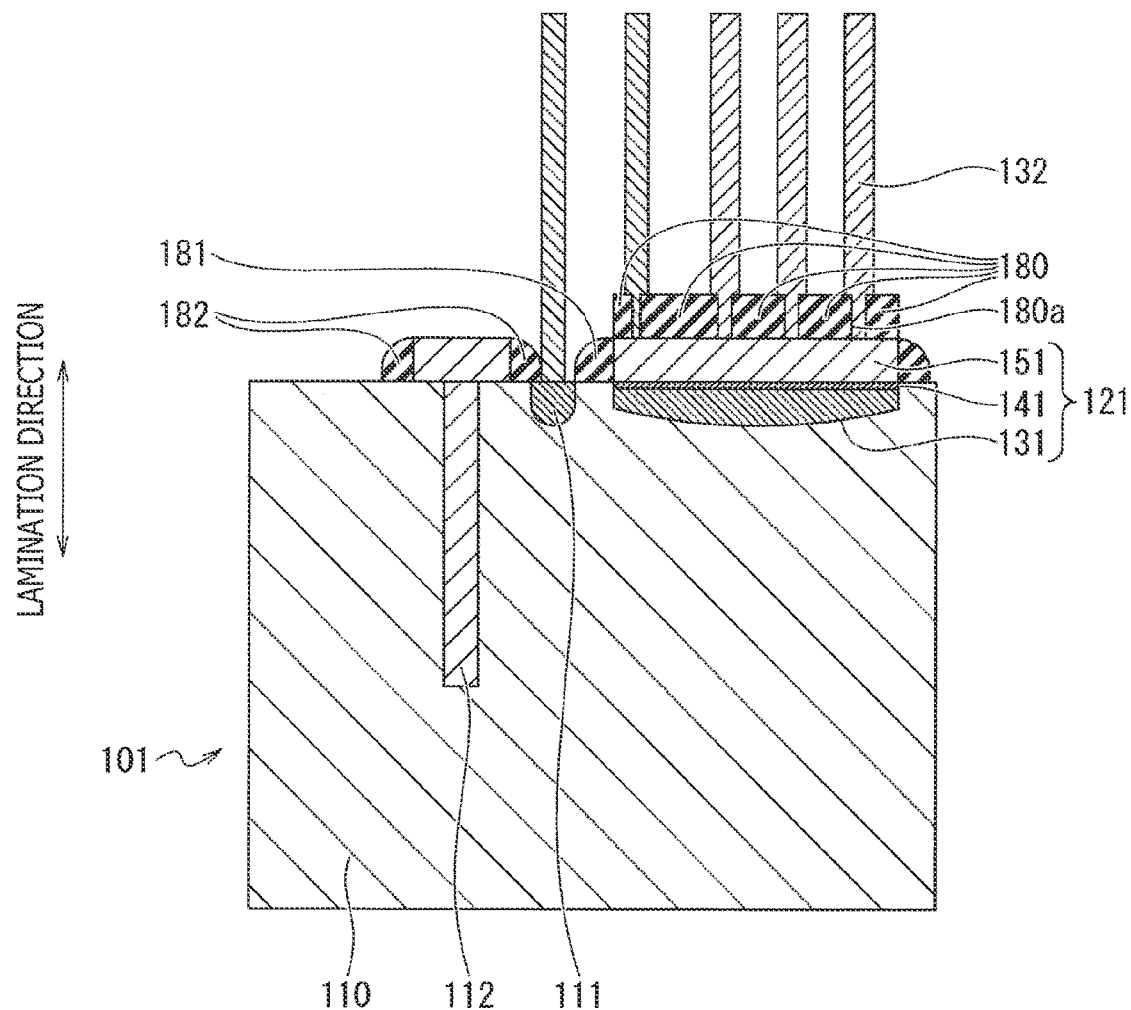
FIG. 23 is a cross-sectional diagram depicting a configuration of a solid-state imaging element according to a sixth embodiment.

Specifically, as depicted in FIG. 23, multiple openings 180*a* are formed in a surface of the inter-capacitor insulation film 180 (upper surface in FIG. 23) on the side facing the second dielectric film 142.

Each of the multiple openings 180*a* is formed in such a shape that an opening area as viewed in a length direction of the third electrode 132 (up-down direction in FIG. 23) becomes smaller than a cross-sectional area of a pre-defined portion included in the third electrode 132 and covered by the second dielectric film 142, as viewed in the length direction of the third electrode 132.

Accordingly, a portion included in the third electrode 132 and disposed inside each of the openings 180*a* has a smaller cross-sectional area as viewed in the length direction of the third electrode 132 than that of the portion included in the third electrode 132 and covered by the second dielectric film 142.

<Solid-State Imaging Element Manufacturing Method>

A manufacturing method for manufacturing the solid-state imaging element of the sixth embodiment will be described with reference to FIG. 24 along with FIG. 23. Note that description of steps similar to the corresponding steps of the manufacturing method for manufacturing the solid-state imaging element of the fifth embodiment is omitted.

Figure 24:
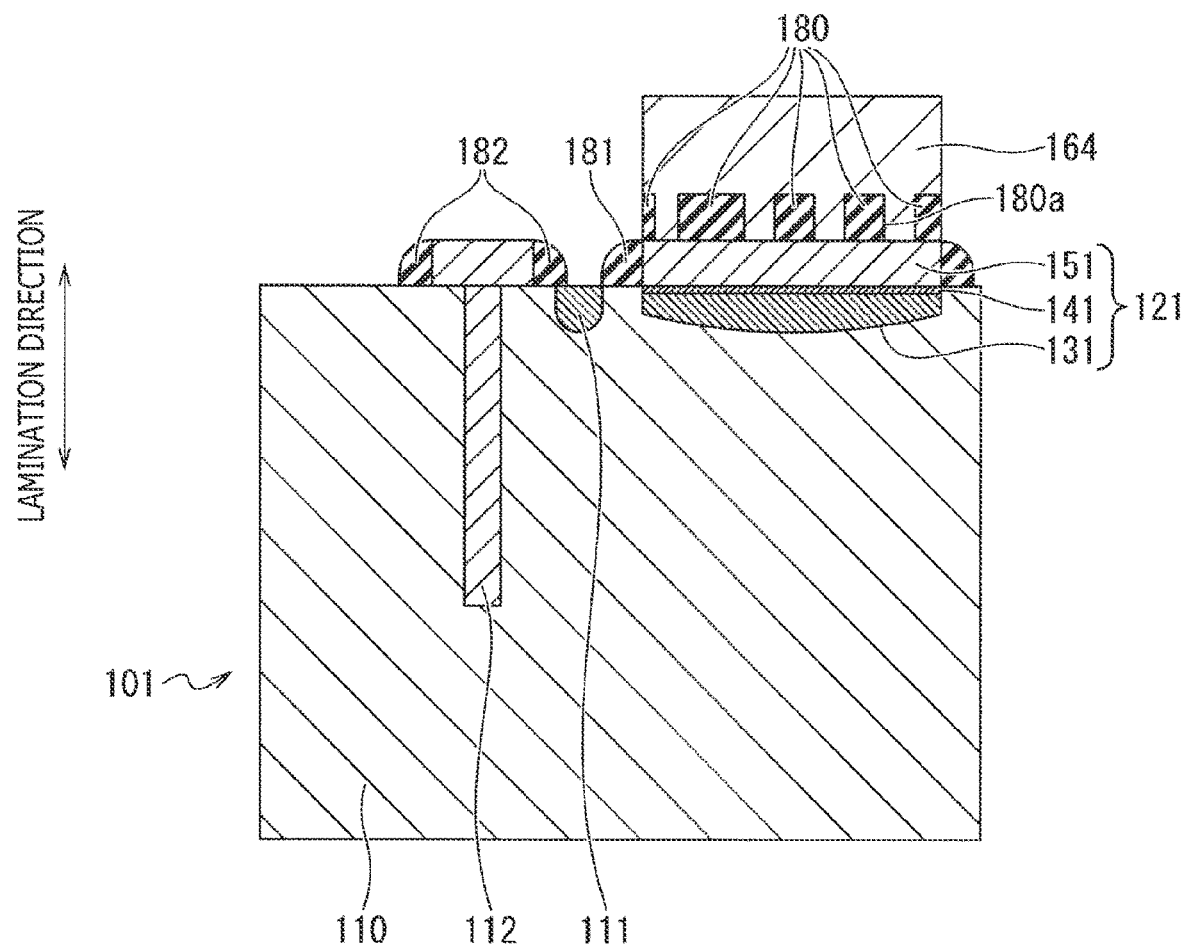
FIG. 24 is a cross-sectional diagram depicting a solid-state imaging element manufacturing method according to the sixth embodiment.

As depicted in FIG. 24, the manufacturing method of the solid-state imaging element forms the multiple openings 180*a* in the surface that is included in the inter-capacitor insulation film 180 and that faces the second dielectric film 142, in the step of forming the inter-capacitor insulation film 180. At this time, each of the multiple openings 180*a* is formed in such a shape that an opening area as viewed in the length direction of the third electrode 132 becomes smaller than the cross-sectional area of a pre-defined portion in the third electrode 132 as viewed in the length direction of the third electrode 132.

According to the configuration of the sixth embodiment, as depicted in FIG. 23, a contact area between the third electrode 132 and the inter-capacitor insulation film 180 in the exposed state of the third electrode 132 after removal of a part of the interlayer insulation film 103 can be larger than that area of the fifth embodiment. In this manner, the solid-state imaging element provided herein can achieve reduction of a fall of the third electrode 132 in comparison with the configuration of the fifth embodiment.

In addition, according to the configuration of the sixth embodiment, the openings 180*a* are formed in the surface that is included in the inter-capacitor insulation film 180 and that faces the second dielectric film 142, in the step of forming the inter-capacitor insulation film 180. In this manner, the solid-state imaging element manufacturing method provided herein can achieve reduction of a fall of the third electrode 132 in comparison with the configuration of the fifth embodiment.

SEVENTH EMBODIMENT

A solid-state imaging element according to a seventh embodiment is different from that of the fifth embodiment in the configuration of the second semiconductor substrate. In the following description, explanation of a part identical to the corresponding part in the fifth embodiment is omitted in some cases.

Figure 25:
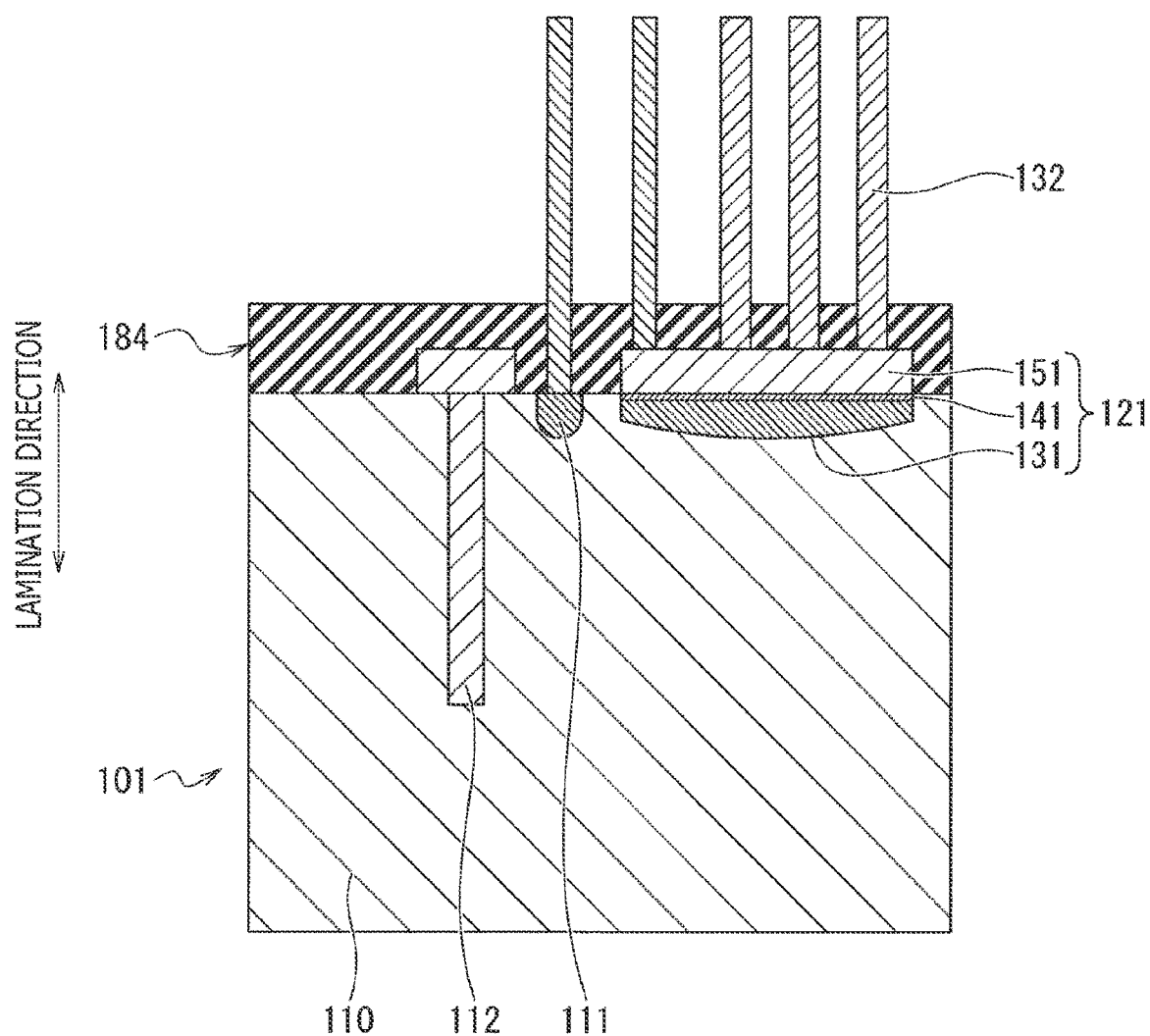
FIG. 25 is a cross-sectional diagram depicting a configuration of a solid-state imaging element according to a seventh embodiment.

Specifically, as depicted in FIG. 25, an integrated insulation film 184 which has a function of the inter-capacitor insulation film 180, a function of the first side wall insulation film 181, and a function of the second side wall insulation film 182 is formed in a region where the second semiconductor substrate 102 will be formed later.

<Solid-State Imaging Element Manufacturing Method>

A manufacturing method for manufacturing the solid-state imaging element of the seventh embodiment will be described with reference to FIG. 26 along with FIG. 25. Note that description of steps similar to the corresponding steps of the manufacturing method for manufacturing the solid-state imaging element of the fifth embodiment is omitted.

Figure 26:
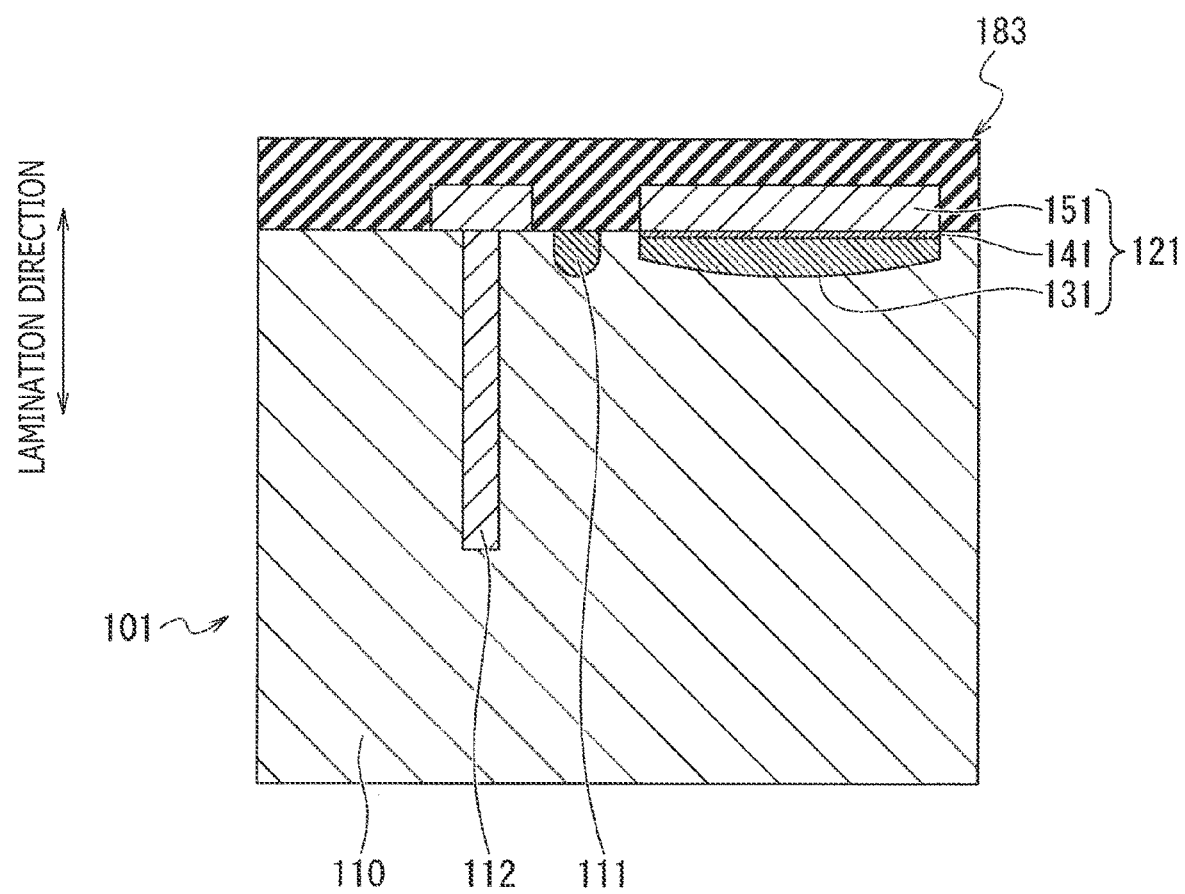
FIG. 26 is a cross-sectional diagram depicting a solid-state imaging element manufacturing method according to the seventh embodiment.

As depicted in FIG. 26, in the solid-state imaging element manufacturing method, the insulation forming film 183, which will become the integrated insulation film 184 later, is deposited on the transfer transistor 112 and a capacitor region. Thereafter, as depicted in FIG. 25, the third electrode 132 is formed, and the insulation forming film 183 is made to function as the integrated insulation film 184.

According to the seventh embodiment, the step of etching the insulation forming film 183 to form the inter-capacitor insulation film 180, the first side wall insulation film 181, and the second side wall insulation film 182 can be eliminated, unlike the configuration of the fifth embodiment. Accordingly, the solid-state imaging element provided herein can achieve simplification of the manufacturing step.

In addition, according to the configuration of the seventh embodiment, the step of etching the insulation forming film 183 to form the inter-capacitor insulation film 180, the first side wall insulation film 181, and the second side wall insulation film 182 can be eliminated, unlike the fifth embodiment. Accordingly, the solid-state imaging element manufacturing method provided herein can achieve simplification of the manufacturing step.

First Application Example

Figure 27:
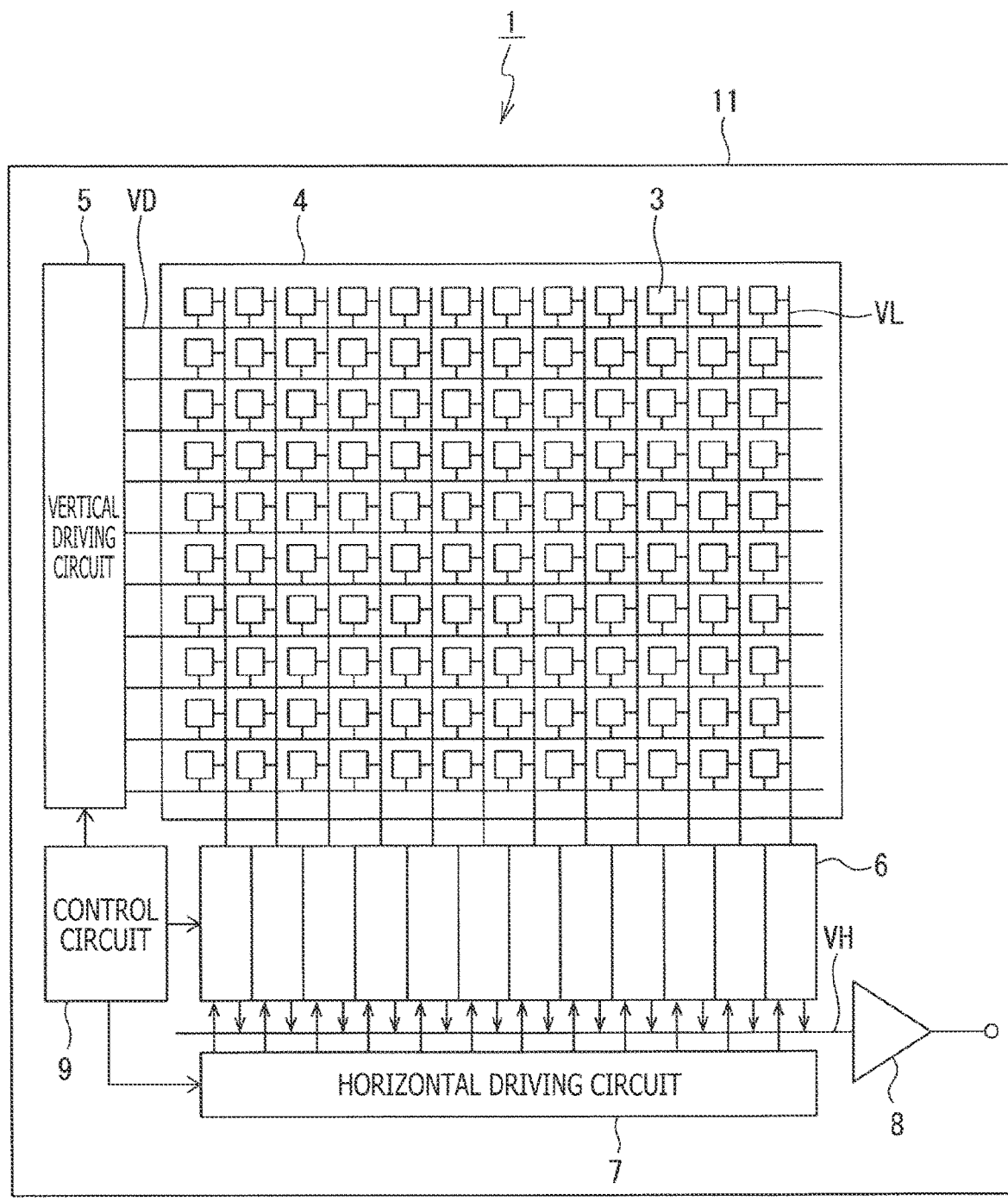
FIG. 27 is a cross-sectional diagram depicting an example of an imaging device in a first application example of the present technology.

For example, the solid-state imaging element of the present technology can have a configuration depicted in FIG. 27.

A solid-state imaging element 1 depicted in FIG. 27 is a CMOS image sensor. In addition, the solid-state imaging element 1 has a pixel region 4 as an imaging area on a semiconductor substrate 100. Further, a peripheral circuit unit (5, 6, 7, 8, 9) including a vertical driving circuit 5, column selection circuits 6, a horizontal driving circuit 7, an output circuit 8, and a control circuit 9, for example, is provided in a peripheral region of the pixel region 4.

For example, the pixel region 4 includes multiple unit pixels 3 (each corresponding to the photodiode 110) two-dimensionally disposed in a matrix form. For example, a pixel driving line VD (specifically, a row selection line and a reset control line) is wired for each pixel row of the unit pixels 3, while a vertical signal line VL is wired for each pixel column. The pixel driving line VD transfers driving signals for reading signals from pixels. One end of the pixel driving line VD is connected to an output end of a corresponding row of the vertical driving circuit 5.

The vertical driving circuit 5 includes a shift register, an address decoder, or the like. The vertical driving circuit 5 drives the respective unit pixels 3 in the pixel region 4 in units of row, for example. Signals output from the respective unit pixels 3 in a pixel row selectively scanned by the vertical driving circuit 5 are supplied to the column selection circuit 6 via the corresponding vertical signal lines VL.

The column selection circuit 6 includes an amplifier, a horizontal selection switch, and the like provided for each of the vertical signal lines VL.

The horizontal driving circuit 7 includes a shift register, an address decoder, or the like. The horizontal driving circuit 7 sequentially drives the respective horizontal selection switches of the column selection circuit 6 while scanning. By the selective scanning performed by using the horizontal driving circuit 7, signals of the respective pixels transferred via the respective vertical signal lines VL are sequentially output to a horizontal signal line VH and transferred to the outside of the semiconductor substrate 100 via the horizontal signal line VH.

The circuit portions including the vertical driving circuit 5, the column selection circuits 6, the horizontal driving circuit 7, and the horizontal signal line VH may be formed on the semiconductor substrate 100 or disposed on an external control IC. Alternatively, these circuit portions may be formed on another substrate connected via a cable or the like.

The control circuit 9 receives a clock given from the outside of the semiconductor substrate 100, data for operation mode commands, and the like and outputs data such as internal information associated with the solid-state imaging element 1. In addition, the control circuit 9 has a timing generator which generates various types of timing signals, and performs driving control of peripheral circuits such as the vertical driving circuit 5, the column selection circuits 6, the horizontal driving circuit 7, and the like on the basis of the various types of timing signals generated by the timing generator.

Second Application Example

Figure 28:
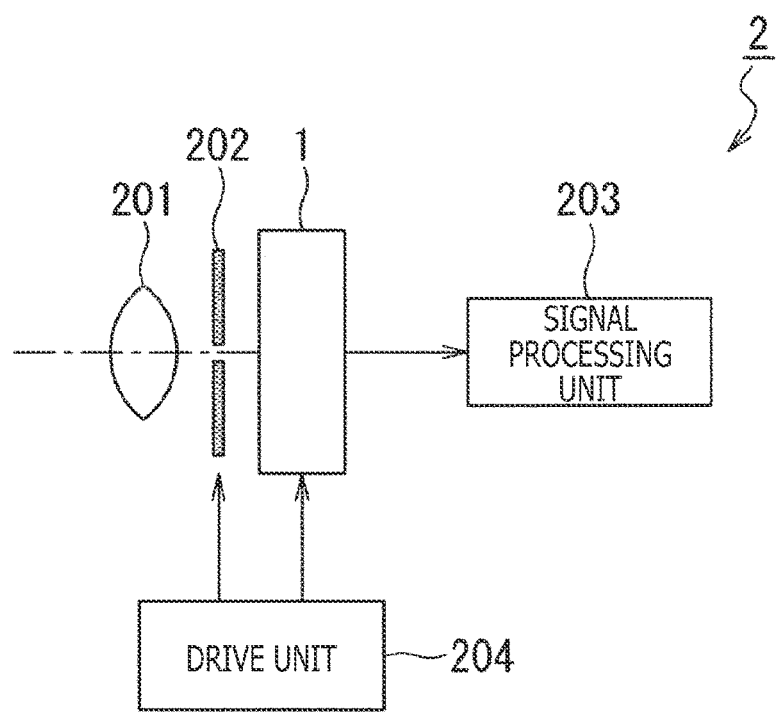
FIG. 28 is a cross-sectional diagram depicting an example of an electronic apparatus in a second application example of the present technology.

The solid-state imaging element of the present technology is applicable to any type of electronic apparatus having an imaging function, such as a camera system like a digital still camera and a video camera, and a cellular phone having an imaging function. For example, FIG. 28 depicts a schematic configuration of an electronic apparatus 2 (camera) as a second application example.

For example, the electronic apparatus 2 is a video camera capable of capturing a still image or a moving image and includes the solid-state imaging element 1, an optical system (optical lens) 201, a shutter device 202, a drive unit 204 which drives the solid-state imaging element 1 and the shutter device 202, and a signal processing unit 203.

The optical system 201 guides image light (incident light) coming from an object to the pixel region 4 of the solid-state imaging element 1. Note that the optical system 201 may include multiple optical lenses.

The shutter device 202 controls a light irradiation period and a light shielding period of light applied to the solid-state imaging element 1.

The drive unit 204 controls a transfer operation of the solid-state imaging element 1 and a shutter operation of the shutter device 202.

The signal processing unit 203 performs various types of signal processing on signals output from the solid-state imaging element 1. Video signals that have been subjected to the signal processing are stored in a storage medium such as a memory or output to a monitor or the like.

Third Application Example

The technology according to the present disclosure (present technology) is applicable to various types of products. For example, the technology according to the present disclosure may be implemented as a device mounted on a mobile body of any one of types, such as a car, an electric car, a hybrid electric car, a motorcycle, a bicycle, a personal mobility, an airplane, a drone, a vessel, and a robot.

Figure 29:
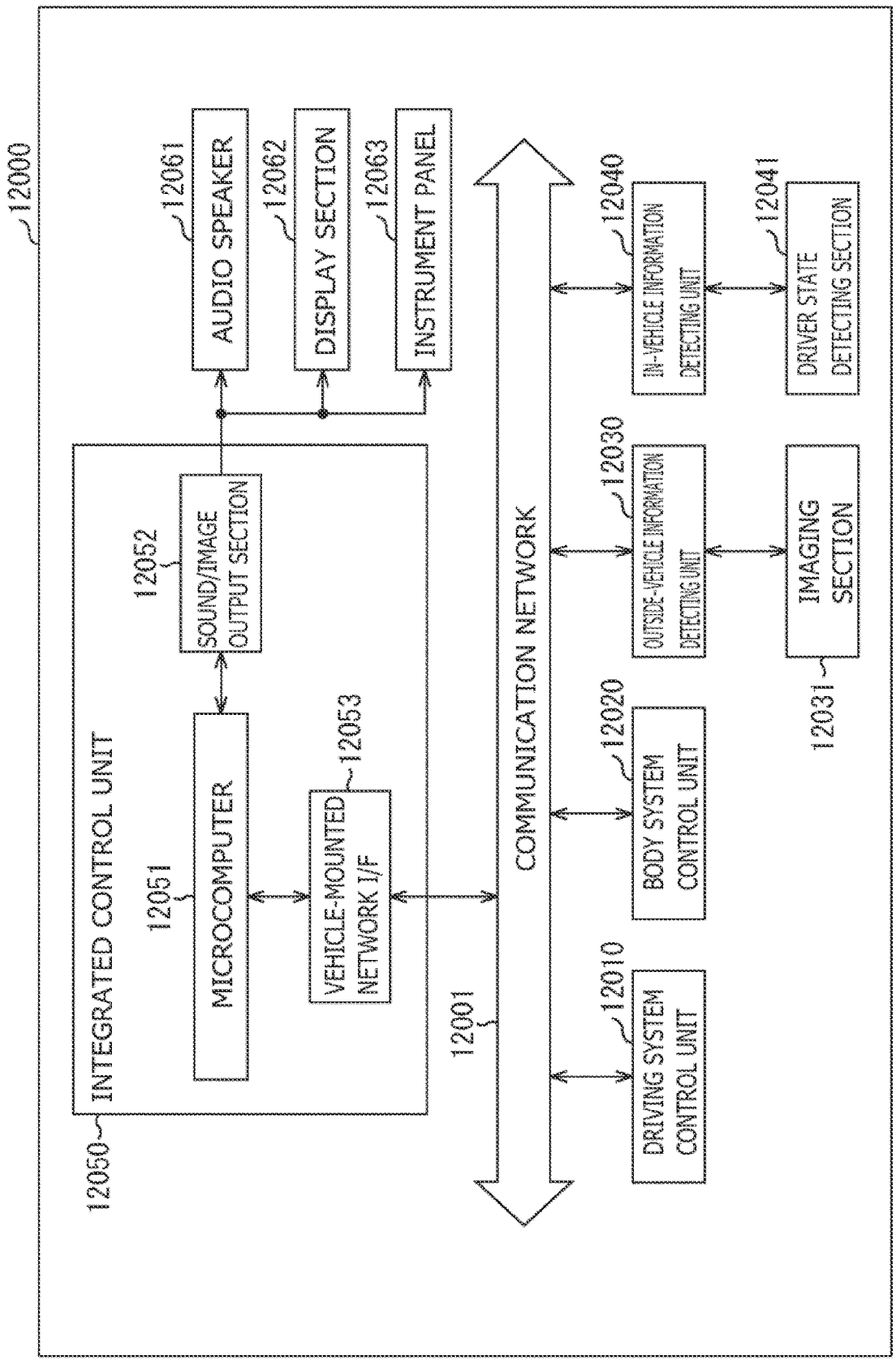
FIG. 29 is a block diagram depicting an example of schematic configuration of a vehicle control system.

FIG. 29 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 29, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 29, an audio speaker 12061, a display section 12062, and an instrument panel 12063 are illustrated as the output device. The display section 12062 may, for example, include at least one of an on-board display and a head-up display.

Figure 30:
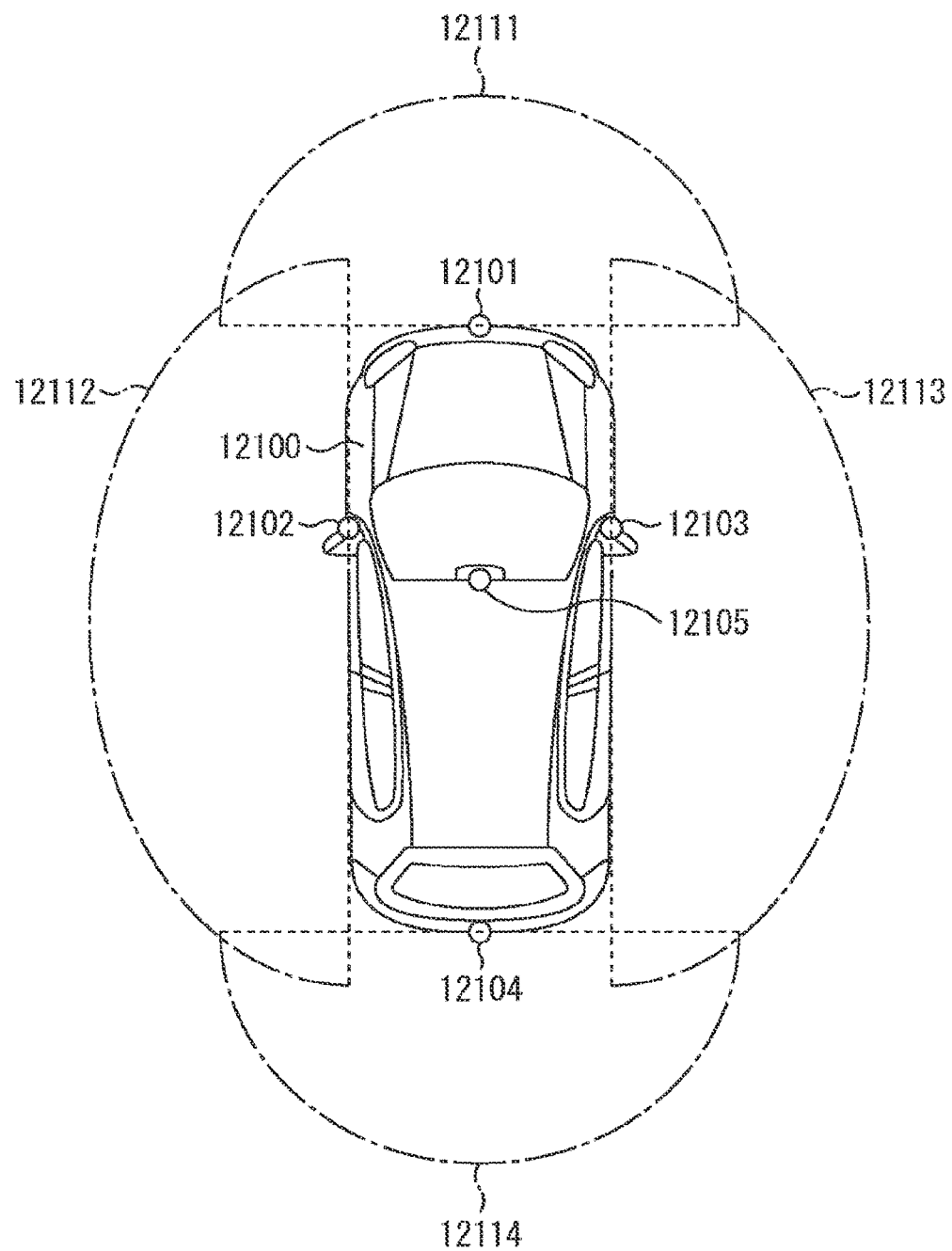
FIG. 30 is a diagram of assistance in explaining an example of installation positions of an outside-vehicle information detecting section and an imaging section.

FIG. 30 is a diagram depicting an example of the installation position of the imaging section 12031.

In FIG. 30, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 30 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Described above has been one example of the vehicle control system to which the technology according to the present disclosure is applicable. The technology according to the present disclosure is applicable to the imaging section 12031 and the like in the configuration described above. Specifically, the solid-state imaging element depicted in each of FIGS. 1 to 4 and FIGS. 11 to 14 is applicable to the imaging section 12031. By applying the technology according to the present disclosure to the imaging section 12031, manufacturing efficiency can be improved.

Fourth Application Example

The technology according to the present disclosure is applicable to various types of products. For example, the technology according to the present disclosure may be applied to an endoscopic surgery system.

Figure 31:
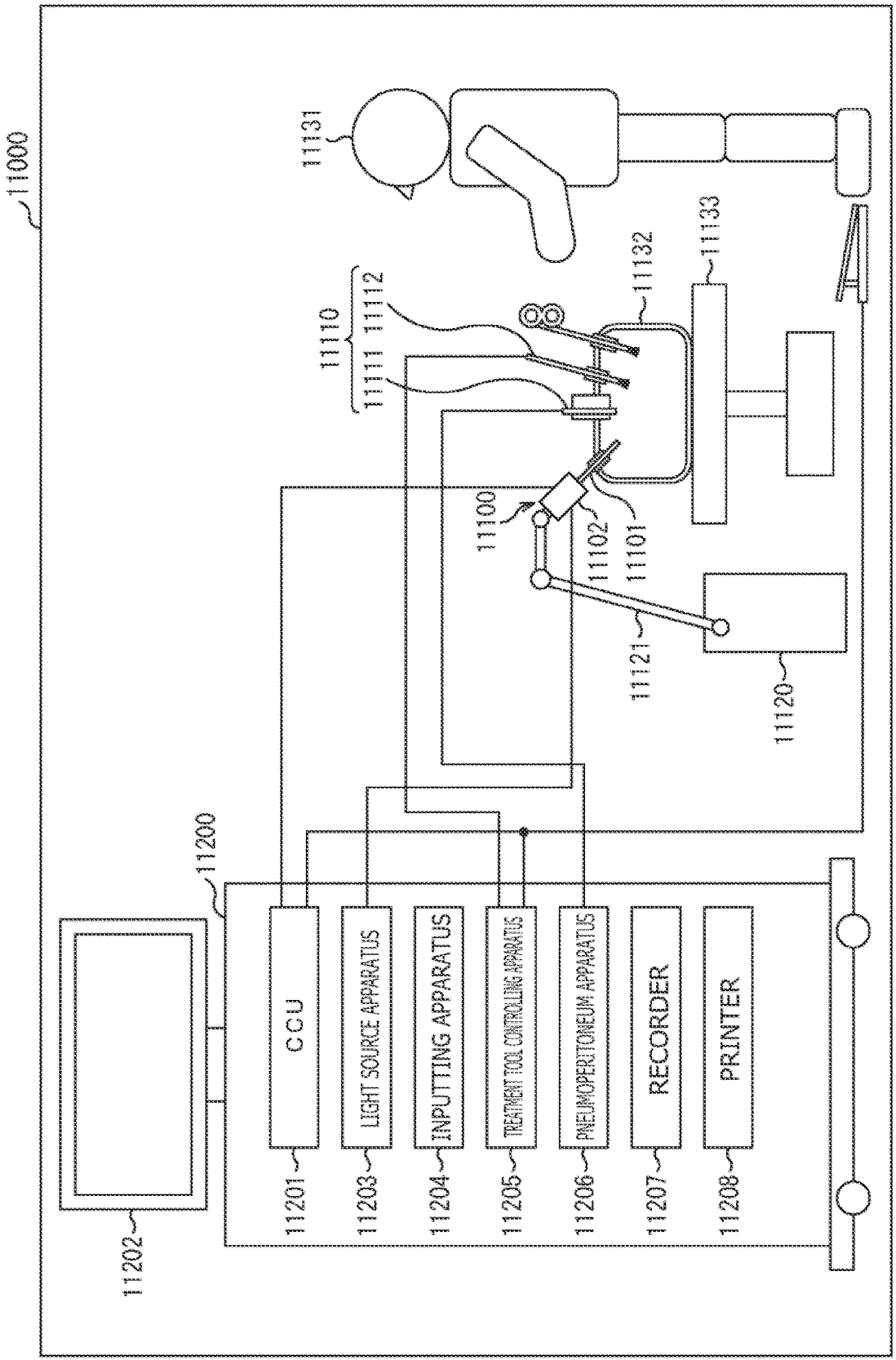
FIG. 31 is a view depicting an example of a schematic configuration of an endoscopic surgery system.

FIG. 31 is a view depicting an example of a schematic configuration of an endoscopic surgery system to which the technology according to an embodiment of the present disclosure (present technology) can be applied.

In FIG. 31, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 32:
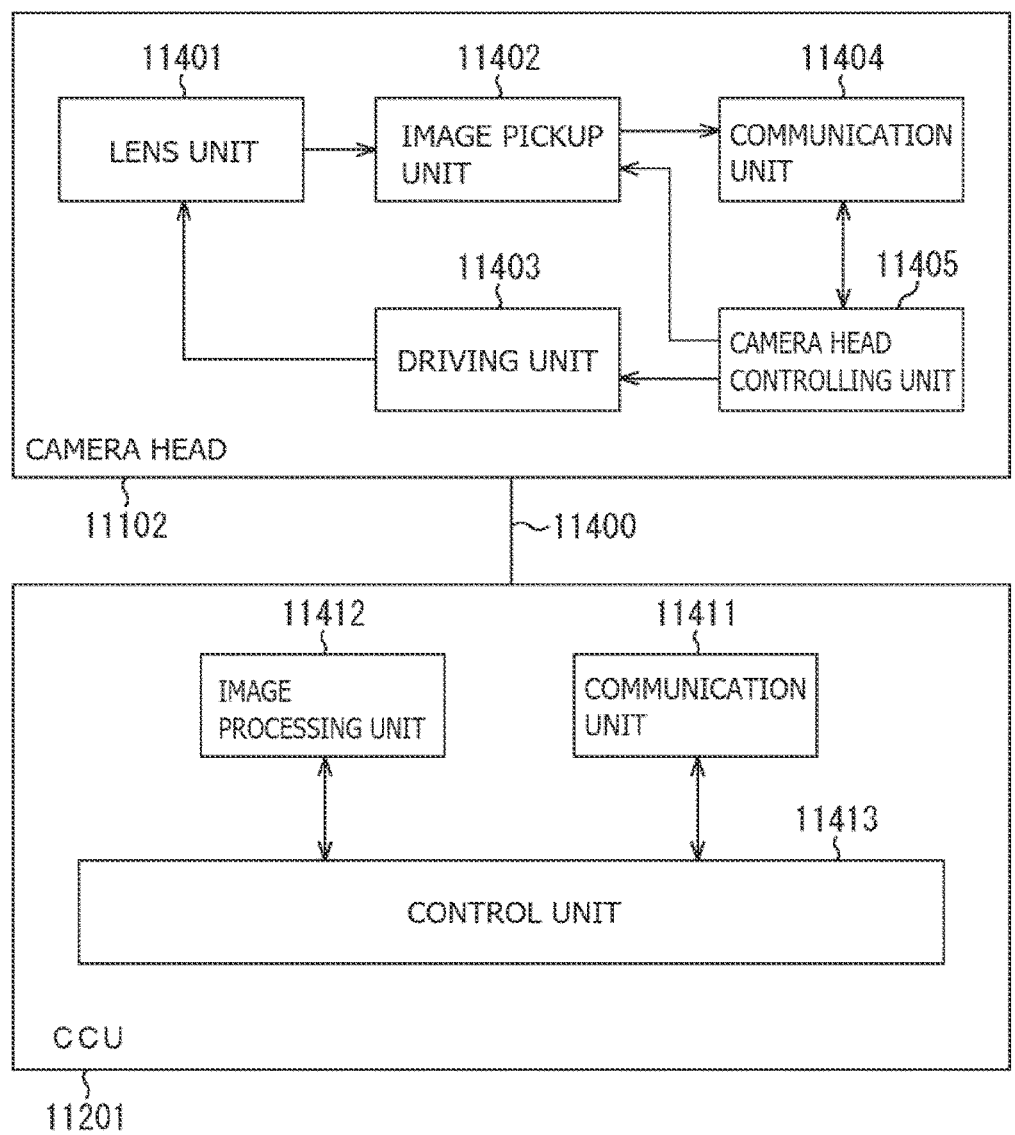
FIG. 32 is a block diagram depicting an example of a functional configuration of a camera head and a camera control unit (CCU).

FIG. 32 is a block diagram depicting an example of a functional configuration of the camera head 11102 and the CCU 11201 depicted in FIG. 31.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Described above has been one example of the endoscopic surgery system to which the technology according to the present disclosure is applicable. For example, the technology according to the present disclosure is applicable to the endoscope 11100 and the camera head 11102 (the image pickup unit 11402 of the camera head 11102) or the like) in the configuration described above. By applying the technology according to the present disclosure to the endoscope 11100 and the image pickup unit 11402, manufacturing efficiency can be improved.

Note that, while the endoscopic surgery system has been described herein by way of example, the technology according to the present disclosure may be applied to a microscopic surgery system or the like, for example.

OTHER EMBODIMENTS

While the embodiments of the present technology have been described above, it should not be understood that the present technology is limited to the statements and the drawings constituting a part of this disclosure. Various alternative embodiments, examples, and operation technologies may become apparent for those skilled in the art in light of this disclosure.

In addition, needless to say, the present technology includes various embodiments and the like not described herein, such as a configuration to which any of the respective configurations described in the above embodiments is applied. Accordingly, the technical scope of the present technology is defined only by inventive specific matters associated with the claims and considered appropriate from the above description.

Further, the semiconductor device of the present disclosure is not required to include all the constituent elements described in the above embodiments and the like. In addition, on the contrary, the semiconductor device of the present disclosure may include other constituent elements.

Note that advantageous effects to be offered are not limited to the advantageous effects described in the present specification presented only by way of example. In addition, other advantageous effects may be produced.

Note that the present technology can employ the following configurations.

(1)

A solid-state imaging element including:

a semiconductor substrate that includes a photodiode configured to photoelectrically convert incident light and a floating diffusion to which a signal charge accumulated in the photodiode is transferred;

a capacitor that includes a PD side electrode disposed on a surface of the photodiode on a side opposite to a surface into which the light enters, and an opposite PD side electrode facing the PD side electrode with a dielectric film interposed between the PD side electrode and the opposite PD side electrode;

an amplification transistor that reads, as an electric signal, the signal charge transferred to the floating diffusion and amplifies the signal charge; and an FD side wiring electrode that connects the floating diffusion and the amplification transistor, in which at least a part of the PD side electrode and the FD side wiring electrode are formed in the semiconductor substrate in such a shape as to extend in a thickness direction of the semiconductor substrate, and one end of a first contact hole in which at least a part of the PD side electrode is formed and one end of a second contact hole in which the FD side wiring electrode is formed are both positioned in a surface of the semiconductor substrate on a side opposite to the photodiode side.

(2)

The solid-state imaging element according to (1) described above, in which the semiconductor substrate includes a first semiconductor substrate where a pixel circuit including the photodiode and the floating diffusion is disposed, and a second semiconductor substrate laminated on a surface of the first semiconductor substrate on the side opposite to the photodiode side, and the capacitor includes a first capacitor portion formed in a first capacitor region defined in the first semiconductor substrate beforehand, and a second capacitor portion disposed on a surface of the first capacitor portion on the side opposite to the photodiode side.

(3)

The solid-state imaging element according to (2) described above, in which the first capacitor portion includes a first electrode disposed on a surface of the first capacitor region on the side opposite to the photodiode side, a first dielectric film laminated on the first electrode, and a second electrode laminated on the first dielectric film, the second capacitor portion includes a third electrode in a columnar shape that forms the PD side electrode and is formed inside the first contact hole with one end of the third electrode connected to the second electrode, a second dielectric film that forms the dielectric film and covers a portion of the third electrode other than a connection portion between the third electrode and the second electrode, and a fourth electrode that forms the opposite PD side electrode and faces the third electrode with the second dielectric film interposed between the fourth electrode and the third electrode, and the first electrode and the floating diffusion are formed apart from each other.

(4)

The solid-state imaging element according to (3) described above, in which the second electrode is formed by using a polycrystal silicon film.

(5)

The solid-state imaging element according to (3) or (4) described above, in which at least either the third electrode or the fourth electrode is formed by using a high melting metal.

(6)

The solid-state imaging element according to any one of (3) to (5) described above, in which the second dielectric film is formed by using a ferroelectric film.

(7)

The solid-state imaging element according to (2) described above, in which the first capacitor portion includes a first electrode disposed on a surface of the first capacitor region on the side opposite to the photodiode side, a first dielectric film laminated on the first electrode, and a second electrode laminated on the first dielectric film, the second capacitor portion includes a third electrode in a columnar shape that forms the PD side electrode and is formed inside the first contact hole with one end of the third electrode connected to the second electrode, a second dielectric film that forms the dielectric film and covers a portion of the third electrode other than a connection portion between the third electrode and the second electrode, and a fourth electrode that forms the opposite PD side electrode and faces the third electrode with the second dielectric film interposed between the fourth electrode and the third electrode, and a part of the first electrode includes the floating diffusion.

(8)

The solid-state imaging element according to (7) described above, in which the second electrode is formed by using a polycrystal silicon film.

(9)

The solid-state imaging element according to (7) or (8) described above, in which at least either the third electrode or the fourth electrode is formed by using a high melting metal.

(10)

The solid-state imaging element according to any one of (7) to (9) described above, in which the second dielectric film is formed by using a ferroelectric film.

(11)

The solid-state imaging element according to (1) described above, in which the semiconductor substrate includes a first semiconductor substrate where a pixel circuit including the photodiode and the floating diffusion is disposed, and a second semiconductor substrate laminated on a surface of the first semiconductor substrate on the side opposite to the photodiode side, the first semiconductor substrate includes a placed electrode laminated on the surface of the photodiode on the side opposite to the surface into which the light enters, and the capacitor includes a third electrode in a columnar shape that forms the PD side electrode and is formed inside the first contact hole with one end of the third electrode connected to the placed electrode, a second dielectric film that forms the dielectric film and covers a portion of the third electrode other than a connection portion between the third electrode and the placed electrode, and a fourth electrode that forms the opposite PD side electrode and faces the third electrode with the second dielectric film interposed between the fourth electrode and the third electrode.

(12)

The solid-state imaging element according to (11) described above, in which at least either the third electrode or the fourth electrode is formed by using a high melting metal.

(13)

The solid-state imaging element according to (11) or (12) described above, in which the second dielectric film is formed by using a ferroelectric film.

(14)

The solid-state imaging element according to (1) described above, in which the capacitor includes
a first capacitor portion formed in a first capacitor region defined in the semiconductor substrate beforehand, and
a second capacitor portion disposed on a surface of the first capacitor portion on the side opposite to the photodiode side, the first capacitor portion includes
a first electrode disposed on a surface of the first capacitor region on the side opposite to the photodiode side,
a first dielectric film laminated on the first electrode, and
a second electrode laminated on the first dielectric film, the second capacitor portion includes
a third electrode in a columnar shape that forms the PD side electrode and is formed inside the first contact hole with one end of the third electrode connected to the second electrode,
a second dielectric film that forms the dielectric film and covers a portion of the third electrode other than a connection portion between the third electrode and the second electrode, and
a fourth electrode that forms the opposite PD side electrode and faces the third electrode with the second dielectric film interposed between the fourth electrode and the third electrode, and the first electrode and the floating diffusion are formed apart from each other.

(15)

The solid-state imaging element according to (14), in which the second electrode is formed by using a polycrystal silicon film.

(16)

The solid-state imaging element according to (14) or (15) described above, in which at least either the third electrode or the fourth electrode is formed by using a high melting metal.

(17)

The solid-state imaging element according to any one of (14) to (16) described above, in which the second dielectric film is formed by using a ferroelectric film.

(18)

The solid-state imaging element according to (1) described above, in which the capacitor includes
a first capacitor portion formed in a first capacitor region defined in the semiconductor substrate beforehand, and
a second capacitor portion disposed on a surface of the first capacitor portion on the side opposite to the photodiode side, the first capacitor portion includes
a first electrode disposed on a surface of the first capacitor region on the side opposite to the photodiode side,
a first dielectric film laminated on the first electrode, and
a second electrode laminated on the first dielectric film, the second capacitor portion includes
a third electrode in a columnar shape that forms the PD side electrode and is formed inside the first contact hole with one end of the third electrode connected to the second electrode,
a second dielectric film that forms the dielectric film and covers a pre-defined portion of the third electrode containing another end of the third electrode, and
a fourth electrode that forms the opposite PD side electrode and faces the third electrode with the second dielectric film interposed between the fourth electrode and the third electrode, the first electrode and the floating diffusion are formed apart from each other, an inter-capacitor insulation film formed between the second electrode and the second dielectric film is provided, a part of the third electrode containing the one end of the third electrode is inserted into the inter-capacitor insulation film, and the pre-defined portion covered by the second dielectric film includes a portion other than the part of the third electrode.

(19)

The solid-state imaging element according to (18) described above, in which the inter-capacitor insulation film is formed by using a material different from a material of the second dielectric film.

(20)

The solid-state imaging element according to (18) or (19) described above, further including:
a first side wall insulation film formed on a side surface of the second electrode, in which
the first side wall insulation film is formed by using a material identical to a material of the inter-capacitor insulation film.

(21)

The solid-state imaging element according to (20) described above, in which the first side wall insulation film is formed by using an oxide film or a nitride film.

(22)

The solid-state imaging element according to any one of (18) to (21) described above, further including:
a transfer transistor that permits or cuts off transfer of an electric charge from the photodiode to the floating diffusion; and
a second side wall insulation film formed on a side surface of the transfer transistor, in which
the second side wall insulation film is formed by using a material identical to a material of the inter-capacitor insulation film.

(23)

The solid-state imaging element according to (22) described above, in which the second side wall insulation film is formed by using an oxide film or a nitride film.

(24)

The solid-state imaging element according to any one of (18) to (23) described above, in which an opening is formed in a surface of the inter-capacitor insulation film on a side facing the second dielectric film, the opening having a smaller opening area as viewed in a length direction of the third electrode than a cross-sectional area of the pre-defined portion of the third electrode as viewed in the length direction.

(25)

A solid-state imaging element manufacturing method including:
- a step of forming, on a semiconductor substrate, a photodiode configured to photoelectrically convert incident light and a floating diffusion to which a signal charge accumulated in the photodiode is transferred;
- a step of forming a capacitor that includes a PD side electrode disposed on a surface of the photodiode on a side opposite to a surface into which the light enters, and an opposite PD side electrode facing the PD side electrode with a dielectric film interposed between the PD side electrode and the opposite PD side electrode; and
- a step of forming an amplification transistor that reads, as an electric signal, the signal charge transferred to the floating diffusion and amplifies the signal charge, in which
- the step of forming the capacitor includes
  - a step of simultaneously forming, in the semiconductor substrate, a first contact hole in which at least a part of the PD side electrode is formed and a second contact hole in which an FD side wiring electrode that connects the floating diffusion and the amplification transistor is formed, the first contact hole and the second contact hole being formed in such a shape as to extend in a thickness direction of the semiconductor substrate, and
  - a step of simultaneously forming the FD side wiring electrode and the PD side electrode.

(26)

A solid-state imaging element manufacturing method including:
- a step of forming, on a semiconductor substrate, a photodiode configured to photoelectrically convert incident light and a floating diffusion to which a signal charge accumulated in the photodiode is transferred;
- a step of forming a capacitor that includes a PD side electrode disposed on a surface of the photodiode on a side opposite to a surface into which the light enters, and an opposite PD side electrode facing the PD side electrode with a dielectric film interposed between the PD side electrode and the opposite PD side electrode; and
- a step of forming an amplification transistor that reads, as an electric signal, the signal charge transferred to the floating diffusion and amplifies the signal charge, in which
- the step of forming the capacitor includes a step of simultaneously forming, in the semiconductor substrate, a first contact hole in which at least a part of the PD side electrode is formed and a second contact hole in which an FD side wiring electrode that connects the floating diffusion and the amplification transistor is formed, the first contact hole and the second contact hole being formed in such a shape as to extend in a thickness direction of the semiconductor substrate.

(27)

A solid-state imaging element manufacturing method including:
- a step of forming, on a semiconductor substrate, a photodiode configured to photoelectrically convert incident light and a floating diffusion to which a signal charge accumulated in the photodiode is transferred;
- a step of forming a capacitor that includes a PD side electrode disposed on a surface of the photodiode on a side opposite to a surface into which the light enters, and an opposite PD side electrode facing the PD side electrode with a dielectric film interposed between the PD side electrode and the opposite PD side electrode; and
- a step of forming an amplification transistor that reads, as an electric signal, the signal charge transferred to the floating diffusion and amplifies the signal charge, in which
- the step of forming the capacitor includes a step of simultaneously forming the PD side electrode in a first contact hole for forming therein at least a part of the PD side electrode, and forming an FD side wiring electrode that connects the floating diffusion and the amplification transistor in a second contact hole for forming therein the FD side wiring electrode.

(28)

A solid-state imaging element manufacturing method including:
- a step of forming, on a semiconductor substrate, a photodiode configured to photoelectrically convert incident light and a floating diffusion to which a signal charge accumulated in the photodiode is transferred; and
- a step of forming a capacitor that includes a PD side electrode disposed on a surface of the photodiode on a side opposite to a surface into which the light enters, and an opposite PD side electrode facing the PD side electrode with a dielectric film interposed between the PD side electrode and the opposite PD side electrode, in which
- the step of forming the capacitor includes
  - a step of forming a first capacitor portion formed in a first capacitor region defined in the semiconductor substrate beforehand, and
  - a step of forming a second capacitor portion disposed on a surface of the first capacitor portion on the side opposite to the photodiode side,
- the step of forming the first capacitor portion includes
  - a step of forming a first electrode disposed on a surface of the first capacitor region on the side opposite to the photodiode side,
  - a step of forming a first dielectric film laminated on the first electrode, and
  - a step of forming a second electrode laminated on the first dielectric film,
- the step of forming the second capacitor portion includes
  - a step of forming a third electrode in a columnar shape that forms the PD side electrode and is formed inside the first contact hole with one end of the third electrode connected to the second electrode,
  - a step of forming a second dielectric film that forms the dielectric film and covers a pre-defined portion of the third electrode containing another end of the third electrode, and
  - a step of forming a fourth electrode that forms the opposite PD side electrode and faces the third electrode with the second dielectric film interposed between the fourth electrode and the third electrode,
- the solid-state imaging element manufacturing method further includes a step of forming an inter-capacitor insulation film between the second electrode and the second dielectric film,
- in the step of forming the inter-capacitor insulation film, a part of the third electrode containing the one end of the third electrode is inserted into the inter-capacitor insulation film, and
- in the step of forming the second dielectric film, a portion of the third electrode other than the part of the third electrode is used as the pre-defined portion and covered with the second dielectric film.

(29)

The solid-state imaging element manufacturing method according to (28) described above, in which, in the step of forming the inter-capacitor insulation film, the inter-capacitor insulation film is formed by using a material different from a material of the second dielectric film.

(30)

The solid-state imaging element manufacturing method according to (28) or (29) described above, further including:

a step of forming a first side wall insulation film on a side surface of the second electrode, in which, in the step of forming the first side wall insulation film, the first side wall insulation film is formed by using a material identical to a material of the inter-capacitor insulation film.

(31)

The solid-state imaging element manufacturing method according to (30) described above, in which, in the step of forming the first side wall insulation film, the first side wall insulation film is formed by using an oxide film or a nitride film.

(32)

The solid-state imaging element manufacturing method according to any one of (28) to (31) described above, further including:

a step of forming a transfer transistor that permits or cuts off transfer of an electric charge from the photodiode to the floating diffusion; and a step of forming a second side wall insulation film formed on a side surface of the transfer transistor, in which, in the step of forming the second side wall insulation film, the second side wall insulation film is formed by using a material identical to a material of the inter-capacitor insulation film.

(33)

The solid-state imaging element manufacturing method according to (32) described above, in which, in the step of forming the second side wall insulation film, the second side wall insulation film is formed by using an oxide film or a nitride film.

(34)

The solid-state imaging element manufacturing method according to any one of (28) to (33) described above, in which, in the step of forming the inter-capacitor insulation film, an opening is formed in a surface of the inter-capacitor insulation film on a side facing the second dielectric film, the opening having a smaller opening area as viewed in a length direction of the third electrode than a cross-sectional area of the pre-defined portion of the third electrode as viewed in the length direction.

REFERENCE SIGNS LIST

1: Solid-state imaging element
2: Electronic apparatus
3: Unit pixel
4: Pixel region
5: Vertical driving circuit
6: Column selection circuit
7: Horizontal driving circuit
8: Output circuit
9: Control circuit
100: Semiconductor substrate
101: First semiconductor substrate
102: Second semiconductor substrate
103: Interlayer insulation film
110: Photodiode
111: Floating diffusion
112: Transfer transistor
113: Reset transistor
114: Amplification transistor
114a: Source-drain region of amplification transistor 114
115: Switch transistor
116: Selection transistor
120: Capacitor
121: First capacitor portion
122: Second capacitor portion
130: PD side electrode
131: First electrode
131a: N+ region
132: Third electrode
140: Dielectric film
141: First dielectric film
142: Second dielectric film
150: Opposite PD side electrode
151: Second electrode
152: Fourth electrode
160: First contact hole
161: FD side wiring electrode
162: Second contact hole
163: Fifth electrode
164: Resist
170: Placed electrode
180: Inter-capacitor insulation film
180a: Opening
181: First side wall insulation film
182: Second side wall insulation film
183: Insulation forming film
184: Integrated insulation film
201: Optical system (optical lens)
202: Shutter device
203: Signal processing unit
204: Drive unit
11000: Endoscopic surgery system
11100: Endoscope
11101: Lens barrel
11102: Camera head
11110: Other surgical tools
11111: Pneumoperitoneum tube
11112: Energy device
11120: Supporting arm apparatus
11131: Surgeon (medical doctor)
11133: Patient bed
11132: Patient
11200: Cart
11201: CCU
11202: Display apparatus
11203: Light source apparatus
11204: Inputting apparatus
11205: Treatment tool controlling apparatus
11206: Pneumoperitoneum apparatus
11207: Recorder
11208: Printer
11400: Transmission cable
11401: Lens unit
11402: Image pickup unit
11403: Driving unit
11404: Communication unit
11405: Camera head controlling unit 11411: Communication unit
11412: Image processing unit
11413: Control unit
12000: Vehicle control system
12001: Communication network
12010: Driving system control unit
12020: Body system control unit
12030: Outside-vehicle information detecting unit
12031 (12101 to 12105): Imaging section
12040: In-vehicle information detecting unit
12041: Driver state detecting section
12050: Integrated control unit
12051: Microcomputer
12052: Sound/image output section
12053: Vehicle-mounted network I/F
12061: Audio speaker
12062: Display section
12063: Instrument panel
12100: Vehicle
12111 to 12114: Imaging range
VD: Pixel driving line
VL: Vertical signal line
VH: Horizontal signal line

What is claimed is:

1. A solid-state imaging element, comprising:
a semiconductor substrate that includes a photodiode (PD) configured to photoelectrically convert incident light and a floating diffusion (FD) to which a signal charge accumulated in the PD is transferred;
a capacitor that includes a PD side electrode disposed on a surface of the PD on a side opposite to a surface into which the light enters, and an opposite PD side electrode facing the PD side electrode with a dielectric film interposed between the PD side electrode and the opposite PD side electrode;
an amplification transistor that reads, as an electric signal, the signal charge transferred to the FD and amplifies the signal charge; and
an FD side wiring electrode that connects the FD and the amplification transistor,
wherein at least a part of the PD side electrode and the FD side wiring electrode are formed in the semiconductor substrate in such a shape as to extend in a thickness direction of the semiconductor substrate,
wherein one end of a first contact hole in which at least a part of the PD side electrode is formed and one end of a second contact hole in which the FD side wiring electrode is formed are both positioned in a surface of the semiconductor substrate on a side opposite to a PD side,
wherein the semiconductor substrate includes:
a first semiconductor substrate where a pixel circuit including the PD and the FD is disposed; and
a second semiconductor substrate laminated on a surface of the first semiconductor substrate on the side opposite to the PD side, and
wherein the capacitor includes:
a first capacitor portion formed in a first capacitor region defined in the first semiconductor substrate; and
a second capacitor portion disposed on a surface of the first capacitor portion on the side opposite to the PD side.

2. The solid-state imaging element according to claim 1, wherein the first capacitor portion includes:
a first electrode disposed on a surface of the first capacitor region on the side opposite to the PD side;
a first dielectric film laminated on the first electrode; and
a second electrode laminated on the first dielectric film,
wherein the second capacitor portion includes:
a third electrode in a columnar shape that forms the PD side electrode and is formed inside the first contact hole with one end of the third electrode connected to the second electrode;
a second dielectric film that forms the dielectric film and covers a portion of the third electrode other than a connection portion between the third electrode and the second electrode; and
a fourth electrode that forms the opposite PD side electrode and faces the third electrode with the second dielectric film interposed between the fourth electrode and the third electrode, and
wherein the first electrode and the FD are formed apart from each other.

3. The solid-state imaging element according to claim 2, wherein the second electrode is formed by using a polycrystal silicon film.

4. The solid-state imaging element according to claim 2, wherein at least either the third electrode or the fourth electrode is formed by using a high melting metal.

5. The solid-state imaging element according to claim 2, wherein the second dielectric film is formed by using a ferroelectric film.

6. The solid-state imaging element according to claim 1, wherein the first capacitor portion includes:
a first electrode disposed on a surface of the first capacitor region on the side opposite to the PD side;
a first dielectric film laminated on the first electrode; and
a second electrode laminated on the first dielectric film,
wherein the second capacitor portion includes;
a third electrode in a columnar shape that forms the PD side electrode and is formed inside the first contact hole with one end of the third electrode connected to the second electrode;
a second dielectric film that forms the dielectric film and covers a portion of the third electrode other than a connection portion between the third electrode and the second electrode; and
a fourth electrode that forms the opposite PD side electrode and faces the third electrode with the second dielectric film interposed between the fourth electrode and the third electrode, and
wherein a part of the first electrode includes the FD.

7. The solid-state imaging element according to claim 6, wherein the second electrode is formed by using a polycrystal silicon film.

8. The solid-state imaging element according to claim 6, wherein at least either the third electrode or the fourth electrode is formed by using a high melting metal.

9. The solid-state imaging element according to claim 6, wherein the second dielectric film is formed by using a ferroelectric film.

10. The solid-state imaging element according to claim 1, wherein the semiconductor substrate includes:
a first semiconductor substrate where a pixel circuit including the PD and the FD is disposed; and
a second semiconductor substrate laminated on a surface of the first semiconductor substrate on the side opposite to the PD side,
wherein the first semiconductor substrate includes a placed electrode laminated on the surface of the PD on the side opposite to the surface into which the light enters, and wherein the capacitor includes:
a third electrode in a columnar shape that forms the PD side electrode and is formed inside the first contact hole with one end of the third electrode connected to the placed electrode,
a second dielectric film that forms the dielectric film and covers a portion of the third electrode other than a connection portion between the third electrode and the placed electrode, and
a fourth electrode that forms the opposite PD side electrode and faces the third electrode with the second dielectric film interposed between the fourth electrode and the third electrode.

11. The solid-state imaging element according to claim 10, wherein at least either the third electrode or the fourth electrode is formed by using a high melting metal.

12. The solid-state imaging element according to claim 10, wherein the second dielectric film is formed by using a ferroelectric film.

13. The solid-state imaging element according to claim 1, wherein the capacitor includes:
a first capacitor portion formed in a first capacitor region defined in the semiconductor substrate beforehand; and
a second capacitor portion disposed on a surface of the first capacitor portion on the side opposite to the PD side,
wherein the first capacitor portion includes:
a first electrode disposed on a surface of the first capacitor region on the side opposite to the PD side;
a first dielectric film laminated on the first electrode; and
a second electrode laminated on the first dielectric film,
wherein the second capacitor portion includes:
a third electrode in a columnar shape that forms the PD side electrode and is formed inside the first contact hole with one end of the third electrode connected to the second electrode;
a second dielectric film that forms the dielectric film and covers a portion of the third electrode other than a connection portion between the third electrode and the second electrode; and
a fourth electrode that forms the opposite PD side electrode and faces the third electrode with the second dielectric film interposed between the fourth electrode and the third electrode, and
wherein the first electrode and the FD are formed apart from each other.

14. The solid-state imaging element according to claim 13, wherein the second electrode is formed by using a polycrystal silicon film.

15. The solid-state imaging element according to claim 13, wherein at least either the third electrode or the fourth electrode is formed by using a high melting metal.

16. The solid-state imaging element according to claim 13, wherein the second dielectric film is formed by using a ferroelectric film.

17. The solid-state imaging element according to claim 1, wherein the capacitor includes:
a first capacitor portion formed in a first capacitor region defined in the semiconductor substrate beforehand; and
a second capacitor portion disposed on a surface of the first capacitor portion on the side opposite to the PD side,
wherein the first capacitor portion includes:
a first electrode disposed on a surface of the first capacitor region on the side opposite to the PD side;
a first dielectric film laminated on the first electrode; and
a second electrode laminated on the first dielectric film,
wherein the second capacitor portion includes:
a third electrode in a columnar shape that forms the PD side electrode and is formed inside the first contact hole with one end of the third electrode connected to the second electrode;
a second dielectric film that forms the dielectric film and covers a pre-defined portion of the third electrode containing another end of the third electrode; and
a fourth electrode that forms the opposite PD side electrode and faces the third electrode with the second dielectric film interposed between the fourth electrode and the third electrode,
wherein the first electrode and the FD are formed apart from each other,
wherein an inter-capacitor insulation film formed between the second electrode and the second dielectric film is provided,
wherein a part of the third electrode containing the one end of the third electrode is inserted into the inter-capacitor insulation film, and
wherein the pre-defined portion covered by the second dielectric film includes a portion other than the part of the third electrode.

18. The solid-state imaging element according to claim 17, wherein the inter-capacitor insulation film is formed by using a material different from a material of the second dielectric film.

19. The solid-state imaging element according to claim 17, further comprising:
a first side wall insulation film formed on a side surface of the second electrode,
wherein the first side wall insulation film is formed by using a material identical to a material of the inter-capacitor insulation film.

20. The solid-state imaging element according to claim 19, wherein the first side wall insulation film is formed by using an oxide film or a nitride film.

21. The solid-state imaging element according to claim 17, further comprising:
a transfer transistor that permits or cuts off transfer of an electric charge from the PD to the FD; and
a second side wall insulation film formed on a side surface of the transfer transistor, wherein the second side wall insulation film is formed by using a material identical to a material of the inter-capacitor insulation film.

22. The solid-state imaging element according to claim 21, wherein the second side wall insulation film is formed by using an oxide film or a nitride film.

23. The solid-state imaging element according to claim 17, wherein an opening is formed in a surface of the inter-capacitor insulation film on a side facing the second dielectric film, the opening having a smaller opening area as viewed in a length direction of the third electrode than a cross-sectional area of the pre-defined portion of the third electrode as viewed in the length direction.

24. A solid-state imaging element manufacturing method, comprising:
a step of forming, on a semiconductor substrate, a photodiode (PD) configured to photoelectrically convert incident light and a floating diffusion (FD) to which a signal charge accumulated in the PD is transferred;
a step of forming a capacitor that includes a PD side electrode disposed on a surface of the PD on a side opposite to a surface into which the light enters, and an opposite PD side electrode facing the PD side electrode with a dielectric film interposed between the PD side electrode and the opposite PD side electrode; and
a step of forming an amplification transistor that reads, as an electric signal, the signal charge transferred to the FD and amplifies the signal charge,
wherein the step of forming the capacitor includes:
- a step of simultaneously forming, in the semiconductor substrate, a first contact hole in which at least a part of the PD side electrode is formed and a second contact hole in which an FD side wiring electrode that connects the FD and the amplification transistor is formed, the first contact hole and the second contact hole being formed in such a shape as to extend in a thickness direction of the semiconductor substrate,
- a step of simultaneously forming the FD side wiring electrode and the PD side electrode;
- a step of forming the semiconductor substrate to have a first semiconductor substrate where a pixel circuit including the PD and the FD is disposed;
- a step of forming a second semiconductor substrate laminated on a surface of the first semiconductor substrate on the side opposite to a PD side;
- a step of forming a first capacitor portion formed in a first capacitor region defined in the first semiconductor substrate; and
- a step of forming a second capacitor portion disposed on a surface of the first capacitor portion on the side opposite to the PD side.

25. A solid-state imaging element manufacturing method, comprising:
- a step of forming, on a semiconductor substrate, a photodiode (PD) configured to photoelectrically convert incident light and a floating diffusion (FD) to which a signal charge accumulated in the PD is transferred;
- a step of forming a capacitor that includes a PD side electrode disposed on a surface of the PD on a side opposite to a surface into which the light enters, and an opposite PD side electrode facing the PD side electrode with a dielectric film interposed between the PD side electrode and the opposite PD side electrode; and
- a step of forming an amplification transistor that reads, as an electric signal, the signal charge transferred to the FD and amplifies the signal charge,
wherein the step of forming the capacitor includes:
  - a step of simultaneously forming, in the semiconductor substrate, a first contact hole in which at least a part of the PD side electrode is formed and a second contact hole in which an FD side wiring electrode that connects the FD and the amplification transistor is formed, the first contact hole and the second contact hole being formed in such a shape as to extend in a thickness direction of the semiconductor substrate;
  - a step of forming the semiconductor substrate to have a first semiconductor substrate where a pixel circuit including the PD and the FD is disposed;
  - a step of forming a second semiconductor substrate laminated on a surface of the first semiconductor substrate on the side opposite to a PD side;
  - a step of forming a first capacitor portion formed in a first capacitor region defined in the first semiconductor substrate; and
  - a step of forming a second capacitor portion disposed on a surface of the first capacitor portion on the side opposite to the PD side.

26. A solid-state imaging element manufacturing method, comprising:
- a step of forming, on a semiconductor substrate, a photodiode (PD) configured to photoelectrically convert incident light and a floating diffusion (FD) to which a signal charge accumulated in the PD is transferred;
- a step of forming a capacitor that includes a PD side electrode disposed on a surface of the PD on a side opposite to a surface into which the light enters, and an opposite PD side electrode facing the PD side electrode with a dielectric film interposed between the PD side electrode and the opposite PD side electrode; and
- a step of forming an amplification transistor that reads, as an electric signal, the signal charge transferred to the FD and amplifies the signal charge,
wherein the step of forming the capacitor includes:
  - a step of simultaneously forming the PD side electrode in a first contact hole for forming therein at least a part of the PD side electrode, and forming an FD side wiring electrode that connects the FD and the amplification transistor in a second contact hole for forming therein the FD side wiring electrode;
  - a step of forming the semiconductor substrate to have a first semiconductor substrate where a pixel circuit including the PD and the FD is disposed;
  - a step of forming a second semiconductor substrate laminated on a surface of the first semiconductor substrate on the side opposite to a PD side;
  - a step of forming a first capacitor portion formed in a first capacitor region defined in the first semiconductor substrate; and
  - a step of forming a second capacitor portion disposed on a surface of the first capacitor portion on the side opposite to the PD side.

27. A solid-state imaging element manufacturing method, comprising:
- a step of forming, on a semiconductor substrate, a photodiode (PD) configured to photoelectrically convert incident light and a floating diffusion (FD) to which a signal charge accumulated in the PD is transferred;
- a step of forming a capacitor that includes a PD side electrode disposed on a surface of the PD on a side opposite to a surface into which the light enters, and an opposite PD side electrode facing the PD side electrode with a dielectric film interposed between the PD side electrode and the opposite PD side electrode,
wherein the step of forming the capacitor includes:
  - a step of forming a first capacitor portion formed in a first capacitor region defined in the semiconductor substrate in a same region as the PD; and
  - a step of forming a second capacitor portion disposed on a surface of the first capacitor portion on the side opposite to a PD side,
  wherein the step of forming the first capacitor portion includes:
    - a step of forming a first electrode disposed on a surface of the first capacitor region on the side opposite to the PD side;
    - a step of forming a first dielectric film laminated on the first electrode; and
    - a step of forming a second electrode laminated on the first dielectric film, wherein the step of forming the second capacitor portion includes:
- a step of forming the PD side electrode in a first contact hole for forming therein at least a part of the PD side electrode, and forming a third electrode in a columnar shape that forms the PD side electrode and is formed inside the first contact hole with one end of the third electrode connected to the second electrode;
- a step of forming a second dielectric film that forms the dielectric film and covers a pre-defined portion of the third electrode containing another end of the third electrode; and
- a step of forming a fourth electrode that forms the opposite PD side electrode and faces the third electrode with the second dielectric film interposed between the fourth electrode and the third electrode; and a step of forming an inter-capacitor insulation film between the second electrode and the second dielectric film, wherein in the step of forming the third electrode, the third electrode is formed in a state where a part of the third electrode containing the one end of the third electrode is inserted into the inter-capacitor insulation film formed in the step of forming the inter-capacitor insulation film, and wherein in the step of forming the second dielectric film, a portion of the third electrode other than the part of the third electrode is used as the pre-defined portion and covered with the second dielectric film.

28. The solid-state imaging element manufacturing method according to claim 27, wherein, in the step of forming the inter-capacitor insulation film, the inter-capacitor insulation film is formed by using a material different from a material of the second dielectric film.

29. The solid-state imaging element manufacturing method according to claim 27, further comprising:
- a step of forming a first side wall insulation film on a side surface of the second electrode,
- wherein, in the step of forming the first side wall insulation film, the first side wall insulation film is formed by using a material identical to a material of the inter-capacitor insulation film.

30. The solid-state imaging element manufacturing method according to claim 29, wherein, in the step of forming the first side wall insulation film, the first side wall insulation film is formed by using an oxide film or a nitride film.

31. The solid-state imaging element manufacturing method according to claim 27, further comprising:
- a step of forming a transfer transistor that permits or cuts off transfer of an electric charge from the PD to the FD; and
- a step of forming a second side wall insulation film formed on a side surface of the transfer transistor,
- wherein, in the step of forming the second side wall insulation film, the second side wall insulation film is formed by using a material identical to a material of the inter-capacitor insulation film.

32. The solid-state imaging element manufacturing method according to claim 31, wherein, in the step of forming the second side wall insulation film, the second side wall insulation film is formed by using an oxide film or a nitride film.

33. The solid-state imaging element manufacturing method according to claim 27, wherein, in the step of forming the inter-capacitor insulation film, an opening is formed in a surface of the inter-capacitor insulation film on a side facing the second dielectric film, the opening having a smaller opening area as viewed in a length direction of the third electrode than a cross-sectional area of the pre-defined portion of the third electrode as viewed in the length direction.

* * * * *